(12) United States Patent
Park et al.

(10) Patent No.: US 11,394,935 B2
(45) Date of Patent: Jul. 19, 2022

(54) PIXEL ARRAY FOR REDUCING IMAGE INFORMATION LOSS AND IMAGE SENSOR INCLUDING THE SAME

(71) Applicant: Samsung Electronics Co., Ltd., Suwon-si (KR)

(72) Inventors: Soyoun Park, Seoul (KR); Byungwook Jung, Gunpo-si (KR)

(73) Assignee: SAMSUNG ELECTRONICS CO., LTD., Gyeonggi-Do (KR)

( * ) Notice: Subject to any disclaimer, the term of this patent is extended or adjusted under 35 U.S.C. 154(b) by 0 days.

(21) Appl. No.: 17/322,048

(22) Filed: May 17, 2021

(65) Prior Publication Data

US 2021/0392303 A1 Dec. 16, 2021

(30) Foreign Application Priority Data

Jun. 15, 2020 (KR) .................. 10-2020-0072618
Mar. 31, 2021 (KR) .................. 10-2021-0042232

(51) Int. Cl.
*H04N 5/225* (2006.01)
*H04N 9/04* (2006.01)
*H04N 5/347* (2011.01)

(52) U.S. Cl.
CPC ......... *H04N 9/04557* (2018.08); *H04N 5/347* (2013.01)

(58) Field of Classification Search
CPC ............... H04N 9/04561; H01L 27/14621
See application file for complete search history.

(56) References Cited

U.S. PATENT DOCUMENTS

| 6,714,243 | B1 * | 3/2004 | Mathur ............. H01L 27/14645 348/273 |
| 8,976,275 | B2 | 3/2015 | Tanaka et al. |
| 9,184,195 | B2 | 11/2015 | Hayashi et al. |
| 9,201,180 | B2 | 12/2015 | Song et al. |
| 9,369,686 | B2 | 6/2016 | Hayashi |
| 9,467,665 | B1 * | 10/2016 | Wang ................. H04N 9/04553 |
| 9,584,742 | B2 | 2/2017 | Park et al. |
| 9,985,063 | B2 | 5/2018 | Oganesian et al. |

(Continued)

FOREIGN PATENT DOCUMENTS

| EP | 3026892 A1 | 6/2016 |
| JP | 2015-201724 A | 11/2015 |
| JP | 2019-161577 A | 9/2019 |

*Primary Examiner* — Timothy J Henn
*Assistant Examiner* — Dwight Alex C Tejano
(74) *Attorney, Agent, or Firm* — Harness, Dickey & Pierce, P.L.C.

(57) ABSTRACT

A pixel array for reducing image information loss and an image sensor including the same are provided. The pixel array includes a plurality of color filter array (CFA) cells having a certain size and each including a plurality of CFA blocks in width and length directions of the CFA cell, wherein each of the CFA blocks includes a sub block, which is at a central region of each of the CFA blocks and includes m*n color pixels, and an outer region, which is other than the sub block and includes color pixels, wherein the m*n color pixels of the sub block include color pixels sensing first through third colors, and the outer region includes a relatively high number of first pixels sensing the first color and a relatively low number of second pixels sensing at least one selected from the second color and the third color.

20 Claims, 20 Drawing Sheets

(56) References Cited

U.S. PATENT DOCUMENTS

| | | | |
|---|---|---|---|
| 2008/0074518 A1* | 3/2008 | Beck | H04N 9/04557 348/272 |
| 2008/0131028 A1* | 6/2008 | Pillman | H04N 9/04555 382/299 |
| 2011/0085063 A1 | 4/2011 | Min et al. | |
| 2011/0102646 A1* | 5/2011 | Minagawa | H04N 5/347 348/242 |
| 2011/0155908 A1* | 6/2011 | Song | G02B 5/201 250/332 |
| 2014/0307131 A1* | 10/2014 | Tanaka | H04N 9/04515 348/273 |
| 2015/0109491 A1* | 4/2015 | Hayashi | H04N 9/04557 348/273 |
| 2015/0189198 A1* | 7/2015 | Park | H04N 5/347 348/302 |
| 2018/0146148 A1* | 5/2018 | Kaneko | H04N 9/04557 |
| 2019/0020865 A1 | 1/2019 | Kang et al. | |
| 2019/0306480 A1 | 10/2019 | Talagala et al. | |

\* cited by examiner

FIG. 6

| 0 | 2 | 0 | 1 | 1.21 | 0 | 1.46 | 0 |
|---|---|---|---|---|---|---|---|
| 2 | 0 | 0 | 0 | 2 | 0 | 0 | 1.46 |
| 0 | 0 | 0 | 1 | 1.46 | 0 | 0 | 0 |
| 1 | 0 | 1 | 0 | 0 | 1.46 | 2 | 1.21 |
| 1.21 | 2 | 1.46 | 0 | 0 | 1 | 0 | 1 |
| 0 | 0 | 0 | 1.46 | 1 | 0 | 0 | 0 |
| 1.46 | 0 | 0 | 2 | 0 | 0 | 0 | 2 |
| 0 | 1.46 | 0 | 1.21 | 1 | 0 | 2 | 0 |

PIXEL ARRAY FOR REDUCING IMAGE INFORMATION LOSS AND IMAGE SENSOR INCLUDING THE SAME

CROSS-REFERENCE TO RELATED APPLICATIONS

This application is based on and claims priority under 35 U.S.C. § 119 to Korean Patent Application Nos. 10-2020-0072618, filed on Jun. 15, 2020 and 10-2021-0042232, filed on Mar. 31, 2021, in the Korean Intellectual Property Office, the disclosures of which are incorporated by reference herein in their entirety.

BACKGROUND

The inventive concepts relate to image sensors, and more particularly, to pixel arrays for reducing image information loss and image sensors including the same.

Image sensors capture a two-dimensional (2D) or three-dimensional (3D) image of an object. Image sensors generate an image of an object using a photoelectric conversion element, which reacts to the intensity of light reflected from the object. With the recent development of complementary metal-oxide semiconductor (CMOS) technology, a CMOS image sensor (CIS) using CMOS has been widely used.

Image sensors may include a pixel array. When image sensors have a higher pixel count, the pixel array may include more color pixels. To convert a raw image output from an image sensor into a certain pattern such as an RGB image, a remosaic process based on interpolation and/or extrapolation may be performed. When a distance to a neighboring color pixel, which may be referred to in this process, increases, loss of image information may occur.

SUMMARY

The inventive concepts provides a pixel array for preventing or reducing image loss from increasing during processing of an image captured by an image sensor.

According to an aspect of the inventive concepts, there is provided a pixel array of an image sensor. The pixel array includes a plurality of color filter array (CFA) cells having a certain size, each of the plurality of CFA cells including a plurality of CFA blocks in a width direction of the CFA cell and a length direction of the CFA cell, wherein each of the plurality of CFA blocks includes a sub block and an outer region other than the sub block, the sub block being at a central region of each of the plurality of CFA blocks and including m*n color pixels, and the outer region including other color pixels, wherein the m*n color pixels of the sub block include color pixels sensing first, second and third colors, and the outer region includes a number of first pixels sensing the first color and a number of second pixels sensing at least one selected from the second color and the third color, the number of first pixels being greater than the number of second pixels.

According to an aspect of the inventive concepts, there is provided a pixel array of an image sensor. The pixel array includes a plurality of color filter array (CFA) cells having a certain size, each of the plurality of CFA cells including 2*2 CFA blocks in a width direction of the CFA cell and a length direction of the CFA cell, each of the 2*2 CFA blocks including 4*4 color pixels. Each of the 2*2 CFA blocks includes a sub block and an outer region, the sub block being at a central region of each of the 2*2 CFA blocks and including 2*2 color pixels, and the outer region being at an outer side of each of the 2*2 CFA blocks and including twelve color pixels. The 2*2 CFA blocks include a red CFA block, a green CFA block, and a blue CFA block; and the sub block includes one red pixel, one blue pixel, and two green pixels, wherein twelve color pixels in the outer region of the red CFA block include one blue pixel and eleven red pixels.

According to an aspect of the inventive concepts, there is an image sensor. The image sensor includes a pixel array including a plurality of color filter array (CFA) cells each including a plurality of CFA blocks in a width direction of the CFA cell and a length direction of the CFA cell, each of the plurality of CFA blocks including a sub block and an outer region other than the sub block, the sub block being at a central region of each of the plurality of CFA blocks and including n*n color pixels, and the outer region including other color pixels, where "n" is an integer of at least 2. The pixel array further includes a read circuit configured to read pixel values from color pixels of the pixel array. The n*n color pixels of the sub block include color pixels sensing first, second and third colors, and the outer region includes a number of first pixels sensing one of the first, second and third colors and a number of second pixels sensing another one of the first, second and third colors, the number of first pixels being greater than the number of second pixels.

BRIEF DESCRIPTION OF THE DRAWINGS

Embodiments of the inventive concepts will be more clearly understood from the following detailed description taken in conjunction with the accompanying drawings in which:

FIG. 6 shows an example of an interpolation distance of each of color pixels included in CFA cells in FIG. 4;

DETAILED DESCRIPTION OF SOME EXAMPLE EMBODIMENTS

Hereinafter, example embodiments will be described in detail with reference to the accompanying drawings.

Figure 1:
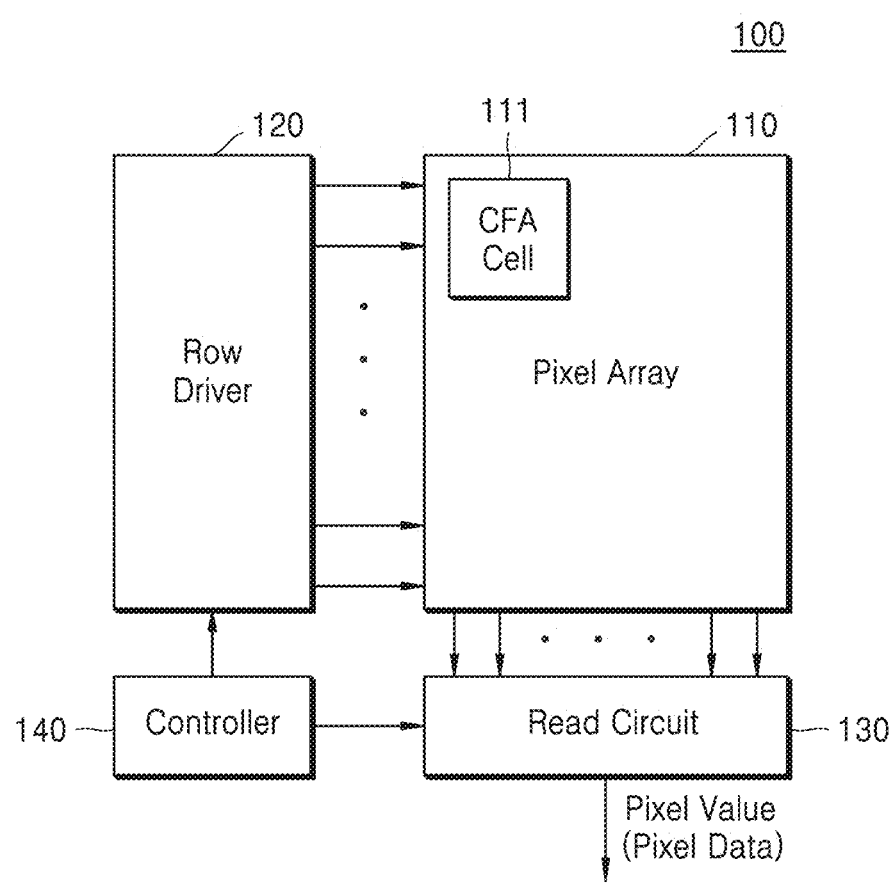
FIG. 1 is a block diagram of an image sensor including a pixel array, according to some example embodiments.

FIG. 1 is a block diagram of an image sensor including a pixel array, according to some example embodiments.

Referring to FIG. 1, an image sensor 100 may include a pixel array 110, a row driver 120, a read circuit 130, and a controller 140. The image sensor 100 may include a complementary metal-oxide semiconductor (CMOS) image sensor (CIS).

The controller 140 may control the row driver 120 and the read circuit 130. The pixel array 110 may include a plurality of pixels (e.g., color pixels). Each of the pixels may include at least one photosensitive element (not shown). The photosensitive element may sense light in each pixel and generate an electrical signal according to the intensity of the sensed light. The photosensitive element may include a photodiode, a photogate, a phototransistor, or the like. The pixel array 110 may include color pixels in various patterns, according to example embodiments. Each of the color pixel may generate, as a pixel signal, an electrical signal related to at least one color. Although not shown in FIG. 1, processing such as remosaicking may be performed on pixel signals of the pixel array 110, and a color pattern of the pixel array 110 may be converted by this processing into a certain pattern such as a Bayer pattern.

The pixel array 110 may output an electrical signal, which corresponds to light absorbed by the photosensitive element, to the read circuit 130. The row driver 120 may output a signal, which controls each of the color pixels of the pixel array 110. For example, the row driver 120 may output a signal, which resets a photosensitive element of each color pixel or controls the photosensitive element to output an electrical signal corresponding to photocharge accumulated therein.

The read circuit 130 may receive an electrical signal from the pixel array 110 and output a pixel value (or pixel data). For example, the read circuit 130 may include an analog-to-digital converter (ADC) and output, as pixel data, a digital signal corresponding to an analog signal received from the pixel array 110.

Although not shown in FIG. 1, pixel data of the image sensor 100 may be provided to an image processing unit (not shown), and a processing operation such as remosaicking may be performed by the image processing unit based on digital signal processing. According to example embodiments, it may be defined that a processing operation such as remosaicking is performed by an element (e.g., a processor) of the image sensor 100 or by a separate processing unit outside the image sensor 100.

Hereinafter, some example embodiments of color pixels of the pixel array 110 will be shown according to example embodiments.

Figure 2:
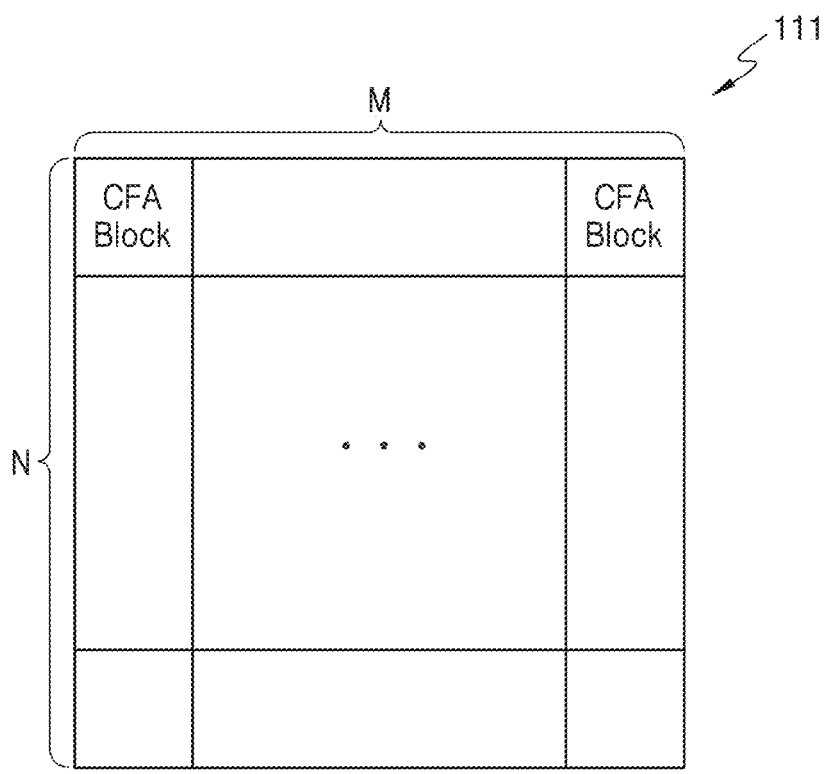
FIGS. 2 and 3 are diagrams of some example embodiments of a pixel array according to example embodiments.
Figure 3:
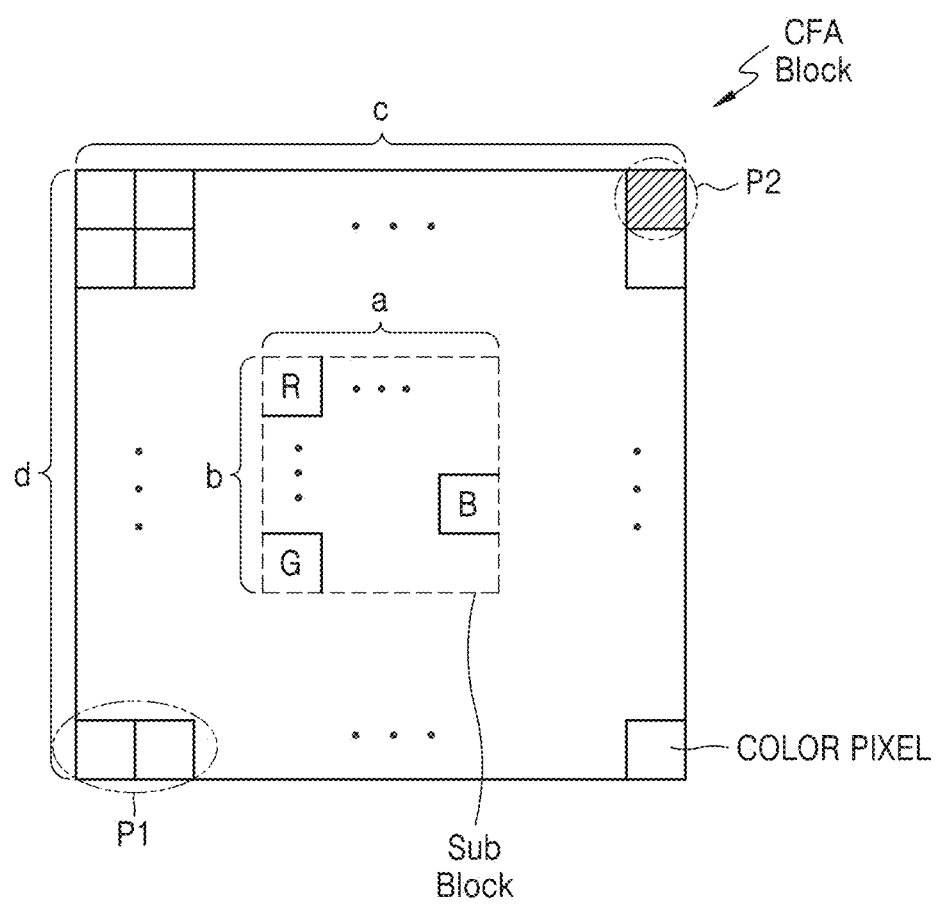

FIGS. 2 and 3 are diagrams of some example embodiments of a pixel array according to example embodiments.

Referring to FIGS. 1 through 3, the image sensor 100 may include the pixel array 110, and a color filter array (CFA) may be provided in the pixel array 110 to allow a certain color to be sensed by each pixel. In the description of example embodiments below, the terms "color filter", "color pixel", "filter array", and "pixel array" may be variously defined. For example, a CFA may be defined as a separate element provided on a pixel array including a photosensitive element or as being included in a pixel array. In other words, a color pixel may be defined as including a corresponding color filter. In the description of example embodiments below, each of a CFA cell, a CFA block, and a sub block may be defined as including a color pixel.

The pixel array 110 may include a plurality of CFA cells 111, which are defined in a certain unit. For example, the pixel array 110 may include a plurality of CFA cells 111 in length and width directions. Each of the CFA cells 111 may include color pixels having a certain size.

Each of the CFA cells 111 may be defined including a plurality of CFA blocks and may refer to a minimum structure of the same CFA blocks. FIG. 2 shows as in some example embodiments, in which a CFA cell 111 includes M*N CFA blocks, such that the CFA cell 111 includes M CFA blocks in the width direction and N CFA blocks in the length direction (M and N being positive integers). The number of color pixels may increase in a high-definition image sensor such as a CIS, and accordingly, the size of the CFA cell 111 and the size of a CFA block may increase.

At this time, in some example embodiments where each CFA block includes the same kind of color pixels (or pixels sensing the same color), when a raw image output from an image sensor is converted into an RGB image, a distance between a color pixel (e.g., a central color pixel) and a neighboring color pixel, which may be referred to during image processing such as interpolation or extrapolation, increases, resulting in loss of image information. In particular, the greater the size of a CFA block, the greater a distance to a neighboring color pixel to be referred to, and accordingly, an image loss rate may also increase.

In example embodiments, the color pixels (or color filters) of the CFA cell 111 and the CFA block of the pixel array 110 may have a pattern that may reduce an image loss rate during image processing. In some example embodiments, in which the CFA cell 111 includes four (or 2*2) CFA blocks and each CFA block senses at least two colors or one CFA block senses all colors applied to the pixel array 110, and some example embodiments that may reduce loss of image information through the reduction of an interpolation distance.

According to some example embodiments, as shown in FIG. 3, a CFA block may include a plurality of color pixels. For example, "c" color pixels are arranged in the width direction and "d" color pixels are arranged in the length direction such that the CFA block includes c*d color pixels (c and d being positive integers). In some example embodiments where the pixel array 110 includes a red color pixel, a blue color pixel, and a green color pixel (respectively referred to as a red pixel, a blue pixel, and a green pixel), the CFA block may include all of the red, blue, and green pixels in example embodiments.

In some example embodiments, a unit including a certain number of pixels in the inside (e.g., a central region or another location) of the CFA block may be referred to as a sub block. The sub block may include a*b color pixels (a and b being positive integers). For example, as shown in FIG. 3, a red pixel R, a blue pixel B, and a green pixel G are arranged all together in the sub block.

In addition, a plurality of color pixels may be arranged in the remaining region (e.g., a border or an outer region of the CFA block) excluding the sub block in the CFA block. For example, a majority number of pixels that sense a particular color and a minority number of pixels (e.g., one or two pixels) that sense other colors may be arranged together in the outer region. In other words, the outer region of the CFA block may include a plurality of first pixels P1, which sense a particular color, and at least one second pixel P2, which senses another color.

According to some example embodiments, a CFA block may be referred to as a red CFA block, a blue CFA block, or a green CFA block according to the kind of color pixels included therein. For example, when the number of red pixels is the highest in a CFA block, the CFA block may be referred to as a red CFA block. When a first pixel P1 in the outer region of a CFA block is a red pixel, the CFA block may be referred to as a red CFA block.

In some example embodiments, the first pixels P1 (or red pixels) may be mainly arranged in the outer region of a red CFA block, and at least one second pixel P2 (e.g., a blue pixel) may be further arranged in the outer region of the red CFA block. For example, mostly red pixels may be arranged in the outer region of the red CFA block, and a blue pixel may be arranged in at least one corner of the outer region of the red CFA block. Similarly, mostly blue pixels may be arranged in the outer region of a blue CFA block, and a red pixel may be arranged in at least one corner of the outer region of the blue CFA block. According to some example embodiments, only green pixels may be arranged in the outer region of a green CFA block, or at least one pixel sensing another color than green may also be arranged in the outer region of the green CFA block.

The red, blue, and green pixels applied to the pixel array 110 in some example embodiments described above are just examples, and embodiments are not limited thereto. For example, color pixels involved in various filters such as a cyan filter and an RGBW filter may be applied to some example embodiments, and some example embodiments are not limited to patterns sensing particular colors.

Specific some example embodiments of a pixel array of an image sensor according to example embodiments will be described below. Although the second pixel P2 is arranged in one corner of the outer region of a CFA block in example embodiments below, some example embodiments are not limited thereto. In other words, at least two second pixels P2 may be arranged in the outer region of a CFA block, as described above. Embodiments may be variously modified. For example, a second pixel P2 may be arranged in another location than the corners of the outer region.

Figure 4:
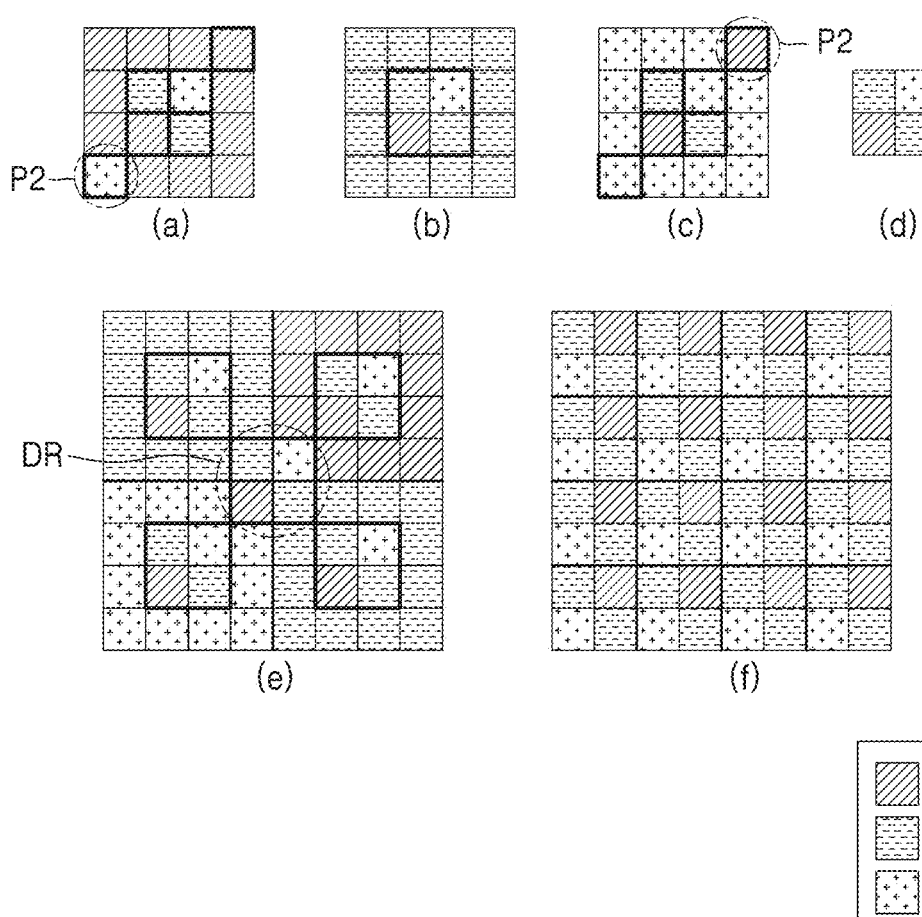
FIG. 4 illustrates pixel arrays and a remosaicked color pattern, according to some example embodiments.

FIG. 4 illustrates pixel arrays and a remosaicked color pattern, according to some example embodiments. Hereinafter, CFA cells including 8*8 pixels are described, but the size of a CFA cell may be variously set in some example embodiments.

According to some example embodiments, a CFA cell includes four CFA blocks, and accordingly, each CFA block may include 4*4 color pixels. For example, when the pixel array described above includes red, green, and blue pixels, each CFA block may include all red, green, and blue pixels. A CFA cell illustrated in (e) of FIG. 4 may include a red CFA block illustrated in (a) of FIG. 4, a green CFA block illustrated in (b) of FIG. 4, and a blue CFA block illustrated in (c) of FIG. 4. The CFA cell having a size of 8*8 may be converted into a Bayer pattern shown in (f) of FIG. 4 by a remosaic process. The CFA cell described above and the Bayer pattern resulting from the conversion may be referred to as a pattern CFA pair or a CFA pattern pair.

Each of the red CFA block, the green CFA block, and the blue CFA block may include a sub block having a certain size, as shown in (d) of FIG. 4. For example, the sub block may include 2*2 color pixels. According to some example embodiments, the sub block includes all red, green, and blue pixels, and accordingly, red, green, and blue colors may be sensed all together by the sub block. A pixel arrangement in the sub block may vary. For example, a green pixel, a blue pixel, a red pixel, and a green pixel (or GBRG) are sequentially arranged on the left top, the right top, the left bottom, and the right bottom of the sub block shown in (d) of FIG. 4.

Various types of CFA cells may be implemented based on the arrangement of four CFA blocks. For example, the CFA cell shown in (e) of FIG. 4 shows an example, in which green, red, blue, and green CFA blocks are sequentially on the left top, the right top, the left bottom, and the right bottom of the CFA cell. For convenience of description, the 8*8 CFA cell shown in (e) of FIG. 4 may be referred to as a GR-GB pattern cell by using first two letters of the GRBG CFA blocks and first two letters of the GBRG pixels of the sub block.

Interpolation of red, green, and blue colors may be needed to remosaic the 8*8 CFA cell into the Bayer pattern using the pair of patterns shown in (e) and (f) of FIG. 4. When interpolation of a green color is performed, relatively many adjacent green pixels may be selected because the green color includes more edge information of an image than a red or blue color. For example, a neighboring green pixel necessary for interpolation may be selected in each of four directions (e.g., a slash direction, a backslash direction, a horizontal direction, and a vertical direction), and the average of distances from a pixel (e.g., a center pixel), for which interpolation is calculated, to neighboring green pixels may be calculated as an interpolation distance of the center pixel. Contrarily, when interpolation of a blue or red color is performed, at least one neighboring pixel may be selected regardless of a direction from a pixel, for which interpolation is calculated.

According to some example embodiments, at least one CFA block may have pixels, which sense at least two colors, in the outer region thereof. For example, as shown in (a) of FIG. 4, the outer region of the red CFA block may mainly include red pixels and one second pixel P2 (e.g., a blue pixel in the left bottom corner). As shown in (c) of FIG. 4, the outer region of the blue CFA block may mainly include blue pixels and one second pixel P2 (e.g., a red pixel in the right top corner). Although it is illustrated in FIG. 4 that all pixels in the outer region of the green CFA block are green pixels, at least one second pixel P2 may be arranged in the outer region of the green CFA block.

Referring to (e) and (f) of FIG. 4, the arrangement of color pixels in the sub block of each CFA block may be the same as that of color pixels in corresponding positions in the Bayer pattern. Accordingly, the interpolation distance of each of color pixels of four sub blocks of one CFA cell may be calculated as 0, and therefore, reduction of the interpolation distance may be accomplished.

As regards to four CFA blocks of a CFA cell, a first region DR that includes a color pixel of each of the four CFA blocks may be defined. The first region DR may include the second pixel P2 of the blue CFA block, the second pixel P2 of the red CFA block, and two green pixels of the respective two green CFA blocks. The arrangement of color pixels in the first region DR may be the same as that of color pixels at corresponding positions in the Bayer pattern. Accordingly, the number of color pixels having an interpolation distance of 0 may increase in a CFA cell, and accordingly, the interpolation distance of the CFA cell may be further reduced.

In other words, according to some example embodiments, there are color pixels having an interpolation distance of 0 according to the pixel arrangement of a CFA cell, and many color pixels, such as the color pixels of the sub block described above and the color pixels of the first region DR, which have an interpolation distance of 0, may be secured. Accordingly, the number of color pixels having an interpolation distance of 0 may be increased in a CFA cell, and therefore, loss of image information may be reduced or prevented.

Figure 5:
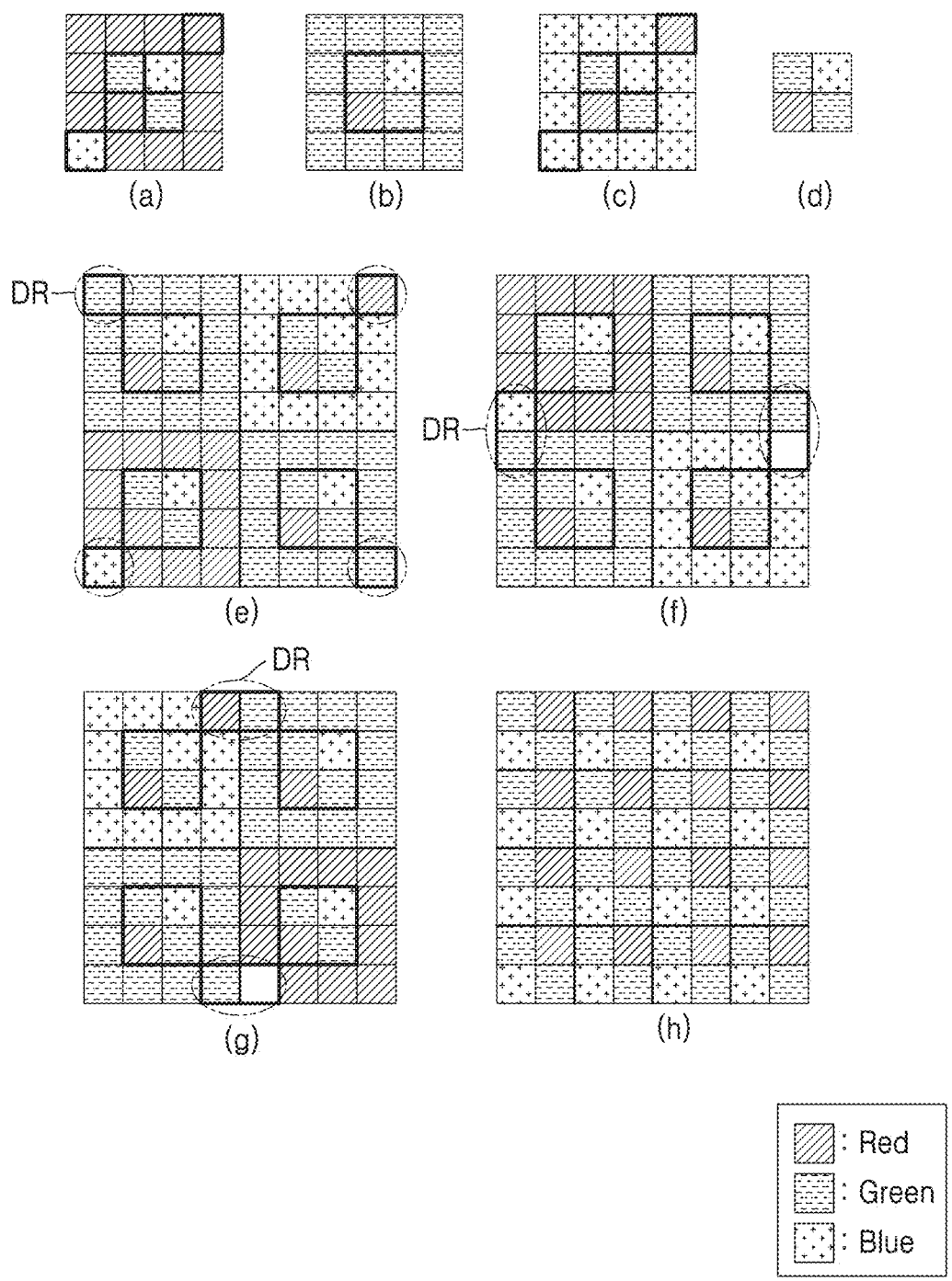
FIG. 5 illustrates some example embodiments of color filter array (CFA) cells according to some example embodiments.

FIG. 5 illustrates some example embodiments of CFA cells according to some example embodiments. In some example embodiments as shown in FIG. 5, a CFA cell includes 2*2 CFA blocks, and a red CFA block, a green CFA block, a blue CFA block, and a sub block respectively shown in (a) through (d) of FIG. 5 are the same as those shown in FIG. 4. CFA cells shown in FIG. 5 may be converted into the Bayer pattern shown in (h) of FIG. 5 by a remosaic process.

A CFA cell shown in (e) of FIG. 5 may include a green CFA block on the left top thereof, a blue CFA block on the right top thereof, a red CFA block on the left bottom thereof, and another green CFA block on the right bottom thereof. Each of the green CFA blocks, the red CFA block, and the blue CFA block may include a sub block. The sub block may include a green pixel, a blue pixel, a red pixel, and a green pixel sequentially on the left top, the right top, the left bottom, and the right bottom thereof.

A CFA cell may be variously implemented according to the arrangement of CFA blocks. For example, a CFA cell shown in (f) of FIG. 5 may include a red CFA block on the left top thereof, a green CFA block on the right top thereof, another green CFA block on the left bottom thereof, and a blue CFA block on the right bottom thereof. A CFA cell shown in (g) of FIG. 5 may include a blue CFA block on the left top thereof, a green CFA block on the right top thereof, another green CFA block on the left bottom thereof, and a red CFA block on the right bottom thereof.

According to some example embodiments described above, the interpolation distance of the color pixels of the sub block of each of the CFA blocks may be 0. The first region DR may be defined as being formed of color pixels respectively positioned in the outer regions of the respective four CFA blocks. The first region DR may include a second pixel (e.g., a red pixel) in the outer region of the blue CFA block, a second pixel (e.g., a blue pixel) in the outer region of the red CFA block, and a green pixel in the outer region of each of the two green CFA blocks. The interpolation distance of the color pixels of the first region DR may have a value of 0.

According to the some example embodiments of CFA cells in FIG. 5, four color pixels in the respective four corners of the CFA cell may form the first region DR in some example embodiments as in (e) of FIG. 5, two color pixels in the middle of each of the left and right sides of the CFA cell may form the first region DR in some example embodiments as in (f) of FIG. 5, and two color pixels in the middle of each of the top and bottom sides of the CFA cell may form the first region DR in some example embodiments as in (g) of FIG. 5.

FIG. 6 shows an example of an interpolation distance of each of color pixels included in the CFA cells in FIG. 4.

According to some example embodiments, when an interpolation distance of each of color pixels to be remosaicked is calculated using the method described above, values shown in FIG. 6 may be obtained. For example, in some example embodiments of interpolation of a green color, two neighboring green pixels that are most adjacent to each other in each of four directions (e.g., the slash direction, the backslash direction, the horizontal direction, and the vertical direction) may be selected. In some example embodiments of interpolation of a red or blue color, two neighboring red or blue pixels that are most adjacent to each other regardless of directions may be selected.

As shown in FIG. 6, the interpolation distance of each of the color pixels of the sub block of each CFA cell and the color pixels of the first region DR may be calculated as 0. In some example embodiments of the other color pixels, distances to neighboring color pixels to be referred to for interpolation may be reduced by using the pair of patterns of (e) and (f) of FIG. 4. Accordingly, the overall average of interpolation distances calculated in a CFA cell may be minimized, and therefore, loss of image information may also be minimized.

Hereinafter, examples of various kinds of color filter arrays that may be implemented according to example embodiments will be described. Embodiments are not limited to the specific examples of color filter arrays described below, and the specific arrangement of pixels of a color filter array may be partially modified as long as the effects of some example embodiments are accomplished.

Figure 7:
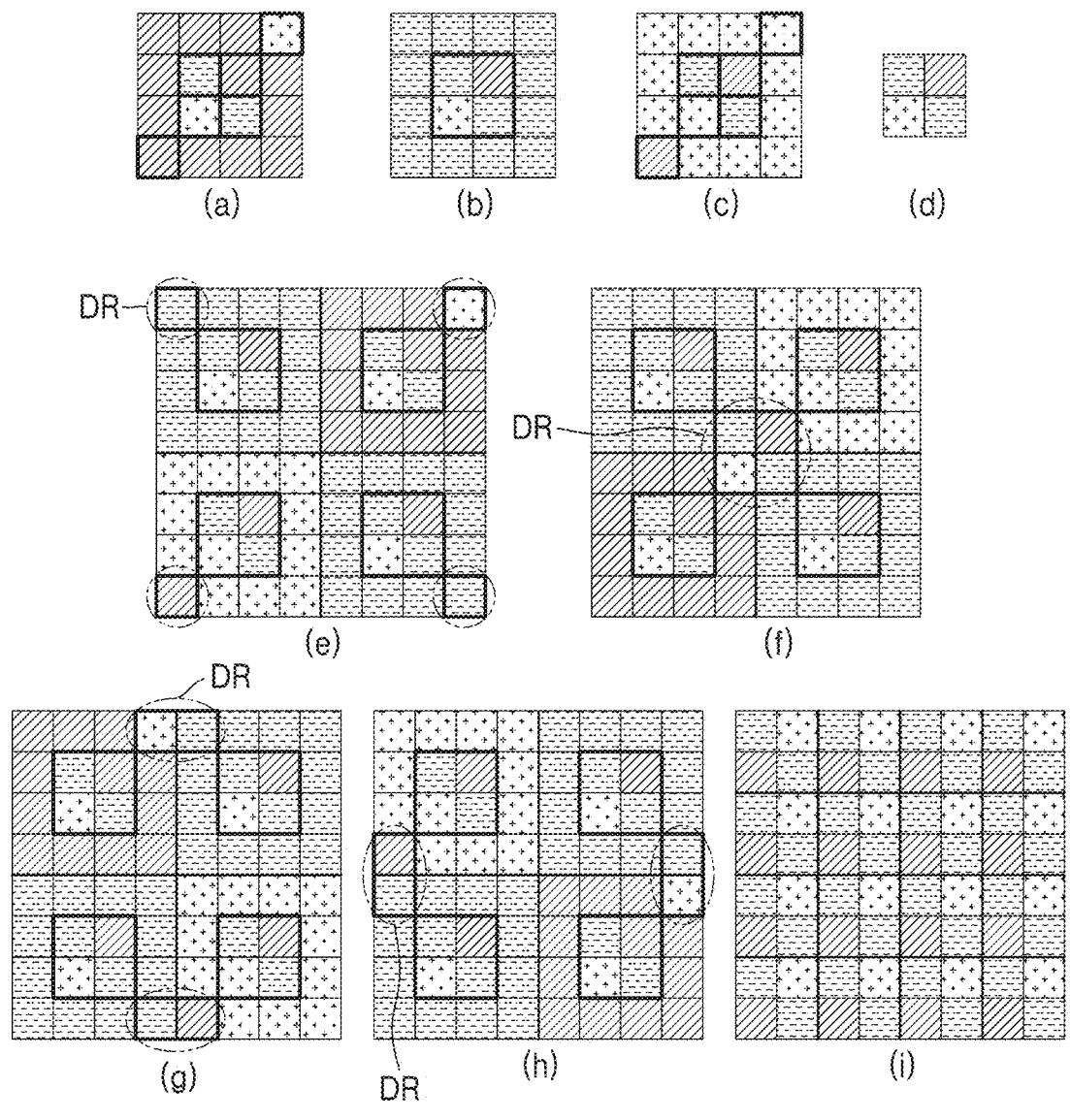
FIGS. 7 through 9 illustrate some example embodiments of pixel arrays according to some example embodiments.
Figure 7:
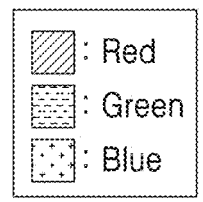
Figure 8:
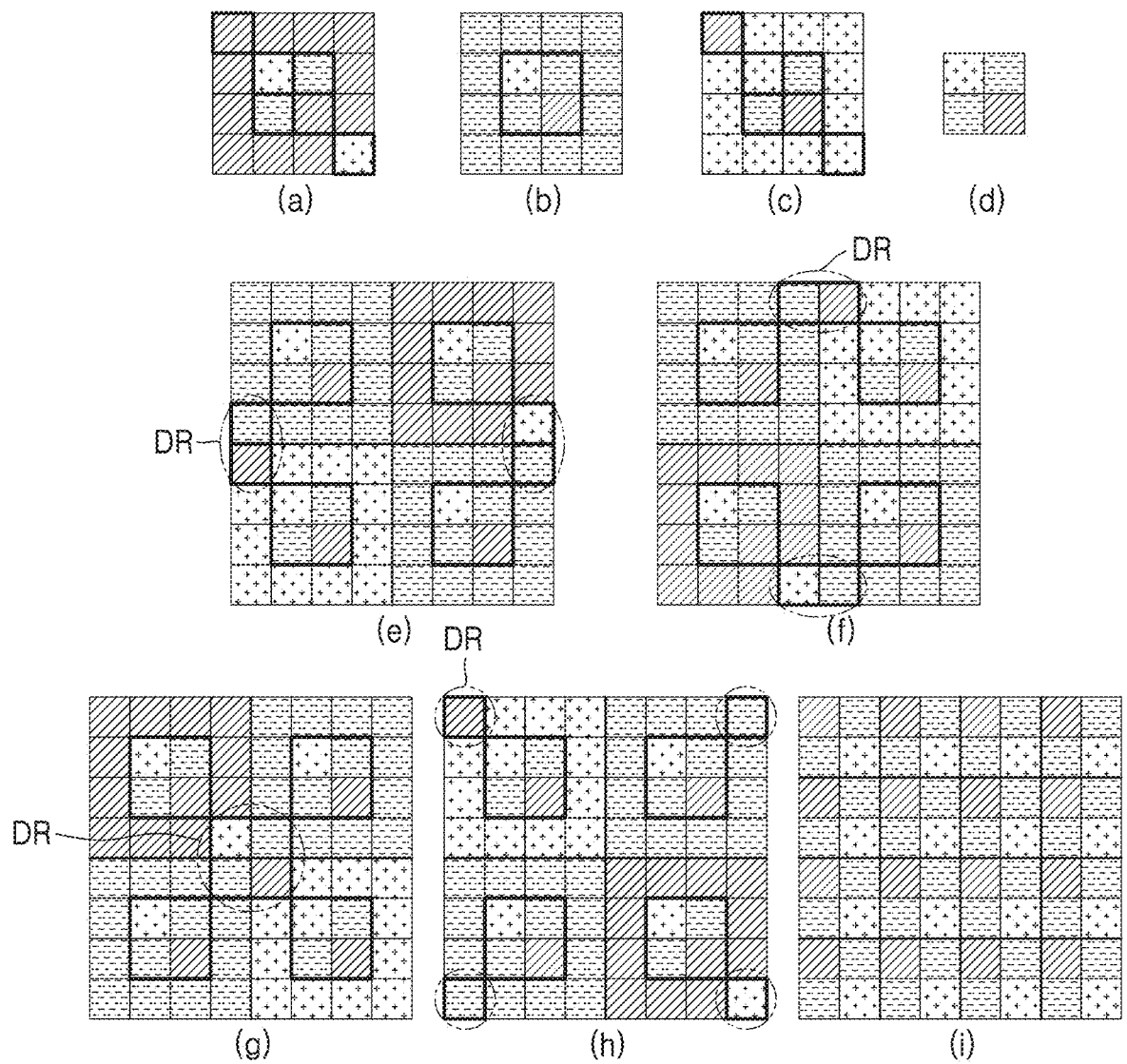
Figure 9:
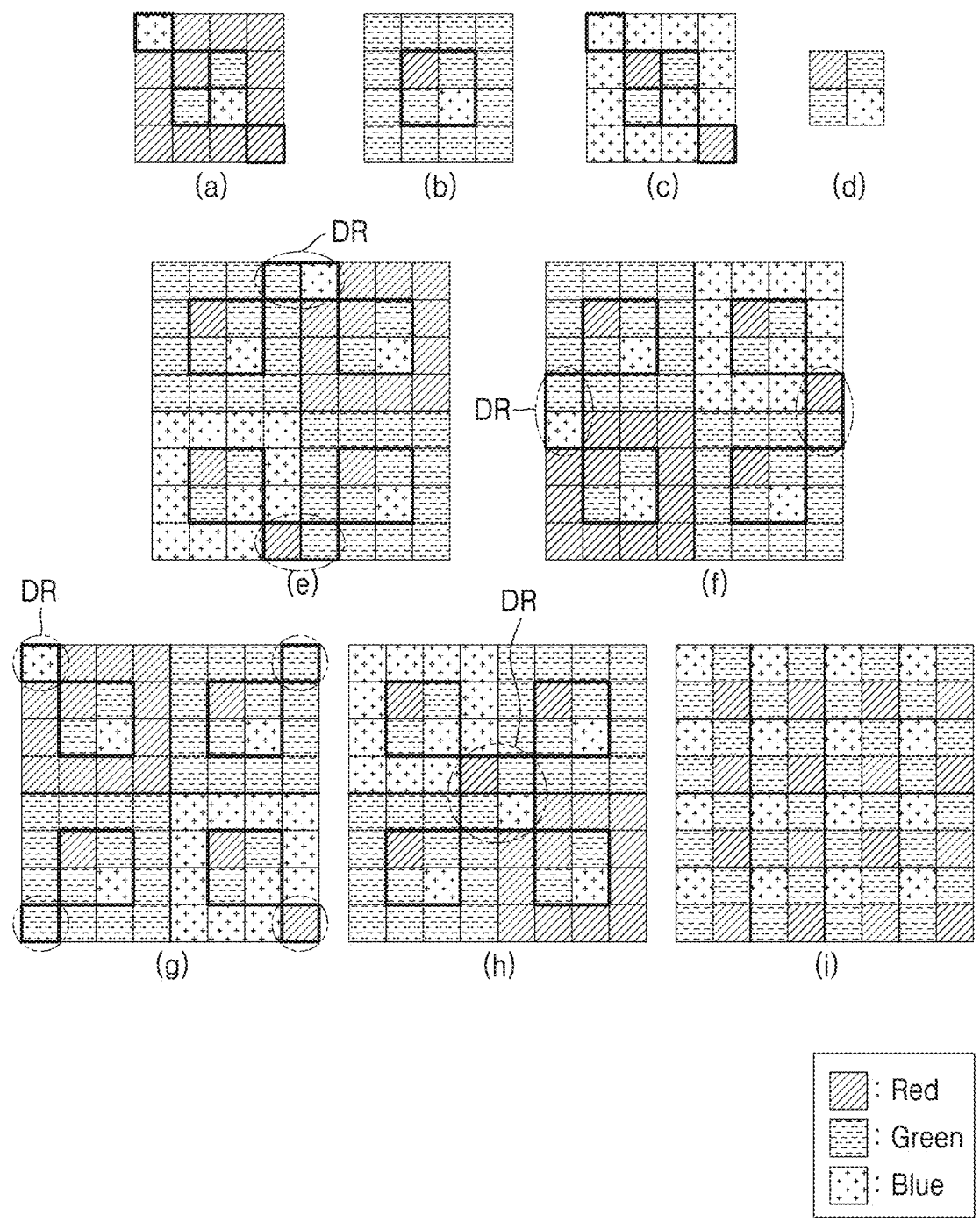

FIGS. 7 through 9 illustrate some example embodiments of pixel arrays according to some example embodiments. FIGS. 7 through 9 illustrate various examples of arrangement of color pixels of a sub block and various examples of arrangement of color pixels in an outer region of a CFA block.

A red CFA block, a green CFA block, and a blue CFA block may be implemented respectively as shown in (a) through (c) of FIG. 7, and each CFA block may include a sub block shown in (d) of FIG. 7. In addition, each CFA cell shown in FIG. 7 may be converted by a remosaic process into a Bayer pattern shown in (i) of FIG. 7.

In some example embodiments of FIG. 7, the sub block of each CFA block may include a green pixel, a red pixel, a blue pixel, and a green pixel sequentially on the left top, the right top, the left bottom, and the right bottom thereof. As shown in (a) of FIG. 7, red pixels may be mainly arranged in the outer region of the red CFA block, and one blue pixel may be further arranged as a second pixel in the outer region of the red CFA block. The blue pixel may be arranged in the right top corner of the outer region of the red CFA block. As shown in (b) of FIG. 7, green pixels may be arranged in the outer region of the green CFA block. For example, a pixel sensing other colors than green may not be arranged in the outer region of the green CFA block. As shown in (c) of FIG. 7, blue pixels may be mainly arranged in the outer region of the blue CFA block, and one red pixel may be further arranged as a second pixel in the outer region of the blue CFA block. The red pixel may be arranged in the left bottom corner of the outer region of the blue CFA block.

The color pixels of each of the red and blue CFA blocks may have a certain pattern according to some example embodiments of the CFA block as described above. For example, blue, red, blue, and red pixels may be sequentially arranged from the right top corner of each of the red and blue CFA blocks to the left bottom corner thereof.

Various types of CFA cells may be implemented based on the arrangement of CFA blocks. For example, referring to (e) of FIG. 7, a CFA cell may include a green CFA block on the left top thereof, a red CFA block on the right top thereof, a blue CFA block on the left bottom thereof, and another green CFA block on the right bottom thereof. Referring to (f) of FIG. 7, a CFA cell may include a green CFA block on the left top thereof, a blue CFA block on the right top thereof, a red CFA block on the left bottom thereof, and another green CFA block on the right bottom thereof. Referring to (g) of FIG. 7, a CFA cell may include a red CFA block on the left top thereof, a green CFA block on the right top thereof, another green CFA block on the left bottom thereof, and a blue CFA block on the right bottom thereof. Referring to (h) of FIG. 7, a CFA cell may include a blue CFA block on the left top thereof, a green CFA block on the right top thereof, another green CFA block on the left bottom thereof, and a red CFA block on the right bottom thereof.

Similarly to some of the example embodiments described above, the interpolation distance of the color pixels in the sub block of each CFA block may have a value of 0, and first regions DR including color pixels having an interpolation distance of 0 may be more secured. According to the some example embodiments of CFA cells in FIG. 7, four color pixels in the respective four corners of the CFA cell may form the first region DR in some example embodiments as in (e) of FIG. 7, four color pixels at the center of the CFA cell may form the first region DR in some example embodiments as in (f) of FIG. 7, two color pixels in the middle of each of the top and bottom sides of the CFA cell may form the first region DR in some example embodiments as in (g) of FIG. 7, and two color pixels in the middle of each of the left and right sides of the CFA cell may form the first region DR in some example embodiments as in (h) of FIG. 7.

FIG. 8 illustrates other some example embodiments of CFA cells. A red CFA block, a green CFA block, and a blue CFA block may be implemented respectively as shown in (a) through (c) of FIG. 8, and each CFA block may include a sub block shown in (d) of FIG. 8. In addition, each CFA cell shown in FIG. 8 may be converted by a remosaic process into a Bayer pattern shown in (i) of FIG. 8.

In some example embodiments of FIG. 8, the sub block of each CFA block may include a blue pixel, a green pixel, a green pixel, and a red pixel sequentially on the left top, the right top, the left bottom, and the right bottom thereof. As shown in (a) of FIG. 8, red pixels may be mainly arranged in the outer region of the red CFA block, and one blue pixel may be further arranged as a second pixel in the outer region of the red CFA block. The blue pixel may be arranged in the right bottom corner of the outer region of the red CFA block. As shown in (b) of FIG. 8, green pixels may be arranged in the outer region of the green CFA block. A pixel sensing other colors than green may not be arranged in the outer region of the green CFA block. As shown in (c) of FIG. 8, blue pixels may be mainly arranged in the outer region of the blue CFA block, and one red pixel may be further arranged as a second pixel in the outer region of the blue CFA block. The red pixel may be arranged in the left top corner of the outer region of the blue CFA block.

Similarly to the example embodiments described above, various types of CFA cells may be implemented. For example, referring to (e) of FIG. 8, a CFA cell may include a green CFA block on the left top thereof, a red CFA block on the right top thereof, a blue CFA block on the left bottom thereof, and another green CFA block on the right bottom thereof. Referring to (f) of FIG. 8, a CFA cell may include a green CFA block on the left top thereof, a blue CFA block on the right top thereof, a red CFA block on the left bottom thereof, and another green CFA block on the right bottom thereof. Referring to (g) of FIG. 8, a CFA cell may include a red CFA block on the left top thereof, a green CFA block on the right top thereof, another green CFA block on the left bottom thereof, and a blue CFA block on the right bottom thereof. Referring to (h) of FIG. 8, a CFA cell may include a blue CFA block on the left top thereof, a green CFA block on the right top thereof, another green CFA block on the left bottom thereof, and a red CFA block on the right bottom thereof.

According to the some example embodiments of CFA cells in FIG. 8, two color pixels in the middle of each of the left and right sides of the CFA cell may form the first region DR in some example embodiments as in (e) of FIG. 8, two color pixels in the middle of each of the top and bottom sides of the CFA cell may form the first region DR in some example embodiments as in (f) of FIG. 8, four color pixels at the center of the CFA cell may form the first region DR in some example embodiments as in (g) of FIG. 8, and four color pixels in the respective four corners of the CFA cell may form the first region DR in some example embodiments as in (h) of FIG. 8.

FIG. 9 illustrates other some example embodiments of CFA cells. A red CFA block, a green CFA block, and a blue CFA block may be implemented respectively as shown in (a) through (c) of FIG. 9, and each CFA block may include a sub block shown in (d) of FIG. 9. In addition, each CFA cell shown in FIG. 9 may be converted by a remosaic process into a Bayer pattern shown in (i) of FIG. 9.

In some example embodiments of FIG. 9, the sub block of each CFA block may include a red pixel, a green pixel, a green pixel, and a blue pixel sequentially on the left top, the right top, the left bottom, and the right bottom thereof. As shown in (a) of FIG. 9, red pixels may be mainly arranged in the outer region of the red CFA block, and one blue pixel may be further arranged as a second pixel in the outer region of the red CFA block. The blue pixel may be arranged in the left top corner of the outer region of the red CFA block. As shown in (b) of FIG. 9, green pixels may be arranged in the outer region of the green CFA block. A pixel sensing other colors than green may not be arranged in the outer region of the green CFA block. As shown in (c) of FIG. 9, blue pixels may be mainly arranged in the outer region of the blue CFA block, and one red pixel may be further arranged as a second pixel in the outer region of the blue CFA block. The red pixel may be arranged in the right bottom corner of the outer region of the blue CFA block.

Similarly to some of the example embodiments described above, various types of CFA cells may be implemented. For example, referring to (e) of FIG. 9, a CFA cell may include a green CFA block on the left top thereof, a red CFA block on the right top thereof, a blue CFA block on the left bottom thereof, and another green CFA block on the right bottom thereof. Referring to (f) of FIG. 8, a CFA cell may include a green CFA block on the left top thereof, a blue CFA block on the right top thereof, a red CFA block on the left bottom thereof, and another green CFA block on the right bottom thereof. Referring to (g) of FIG. 9, a CFA cell may include a red CFA block on the left top thereof, a green CFA block on the right top thereof, another green CFA block on the left bottom thereof, and a blue CFA block on the right bottom thereof. Referring to (h) of FIG. 9, a CFA cell may include a blue CFA block on the left top thereof, a green CFA block on the right top thereof, another green CFA block on the left bottom thereof, and a red CFA block on the right bottom thereof.

According to the some example embodiments of CFA cells in FIG. 9, two color pixels in the middle of each of the top and bottom sides of the CFA cell may form the first region DR in some example embodiments as in (e) of FIG. 9, two color pixels in the middle of each of the left and right sides of the CFA cell may form the first region DR in some example embodiments as in (f) of FIG. 9, four color pixels in the respective four corners of the CFA cell may form the first region DR in some example embodiments as in (g) of FIG. 9, and four color pixels at the center of the CFA cell may form the first region DR in some example embodiments as in (h) of FIG. 9.

According to some example embodiments described above, the color pattern of a pixel array may be variously formed, and a plurality of colors (e.g., red (R), green (G), and blue (B) colors) may be sensed all together by a CFA block having a certain size. Accordingly, distances to neighboring color pixels used for interpolation and/or extrapolation may be reduced, and image loss may also be reduced. When color pixels in an outer region of a CFA block are arranged according to some example embodiments described above, the number of color pixels having an interpolation distance of 0 may be increased in a CFA cell, and accordingly, the overall interpolation distance of the CFA cell may be reduced. As a result, image loss during color conversion may be reduced. Although it has been described in the above embodiments that the outer region of a CFA block includes one different color pixel, various modifications may be made to the outer region of the CFA block to accomplish the effects of some example embodiments. Although it has been described in the above embodiments that a second pixel sensing a different color than green is not arranged in the outer region of a green CFA block, the second pixel sensing a different color may also be arranged in the outer region of the green CFA block according to some example embodiments.

Figure 10:
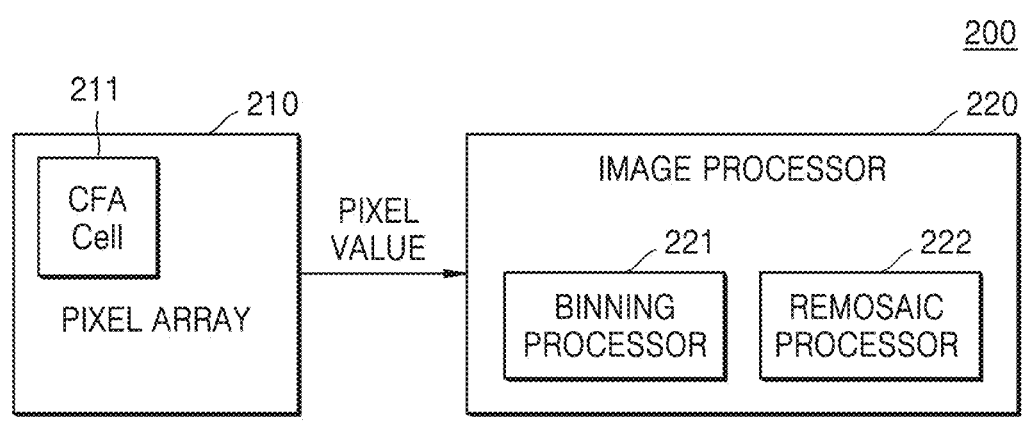
FIG. 10 is a block diagram of an image processing unit according to some example embodiments.

FIG. 10 is a block diagram of an example of an image processing unit including an image sensor, according to some example embodiments.

Referring to FIG. 10, an image processing unit (or an image processing device, 200) may include a pixel array 210, which includes a CFA cell 211, and an image processor 220, which performs image processing using pixel values from the pixel array 210. According to some example embodiments, the image sensor described above may be defined as including the pixel array 210 and at least some of configurations of the image processor 220. For example, the image sensor may be defined as including a configuration for a binning process and/or a configuration for a remosaic process.

The pixel array 210 may include CFA cells 211 having various patterns according to some example embodiments described above, and pixel values of color pixels arranged in the pixel array 210 may be provided to the image processor 220. The image processor 220 may include various kinds of logic units, which process pixel values to generate image data. For example, the image processor 220 may include a binning processor 221 and a remosaic processor 222. Under the control of the binning processor 221, image processing may be performed using pixel values having relatively high resolution when a high-definition mode is selected or using pixel values having relatively low resolution when a low-definition mode is selected. The remosaic processor 222 may perform interpolation of a pixel in relation with a remosaic process. Pixel values corresponding to a Bayer pattern may be generated using pixel values of CFA cells, according to some example embodiments described above.

According to some example embodiments, the pixel array 210 may include the CFA cells (or the CFA blocks) described in the above embodiments, and a binning process may be performed based on the arrangement of color pixels, which has been described in some example embodiments. As a result of performing the binning process, the size of image data processed by the image processor 220 may be reduced, and the size of data per frame may also be reduced, so that a high frame rate may be maintained in a video mode.

According to some example embodiments, the binning process may be performed based on various methods. For example, the binning process may be performed based on a method, in which the image processor 220 performs digital addition of pixel values of color pixels of the pixel array 210. Alternatively or additionally, the binning process may be performed based on a method, in which electrical signals of at least two color pixels of the pixel array 210 are added up in an analog fashion.

According to some example embodiments, color pixels, of which the signals are added up in the binning process, may be variously selected. For example, according to an intra-block method, color pixels sensing the same color in one CFA block may be selected, and signals of the color pixels may be added up in an analog or a digital fashion. For example, all or some of color pixels sensing the same color in one CFA block may be selected.

According to an inter-block method, color pixels sensing the same color in at least two CFA blocks may be selected, and signals of the color pixels may be added up in an analog or a digital fashion. For example, signals of color pixels sensing a same color in one CFA block and in at least one row or column of an adjacent CFA block may be added up.

Figure 11A:
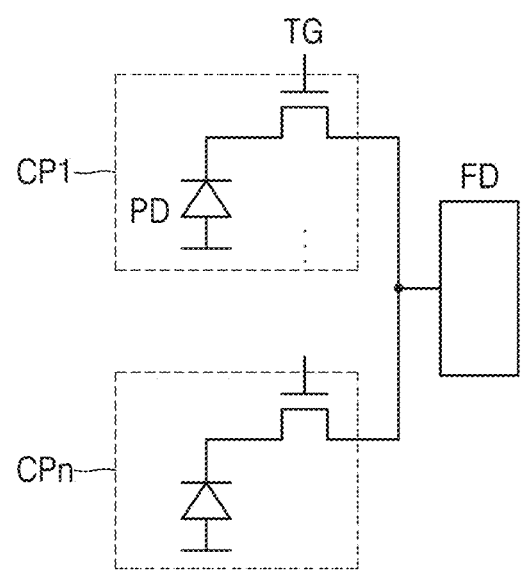
FIGS. 11A through 11C are diagrams of some example embodiments of a pixel array according to some example embodiments.
Figure 11B:
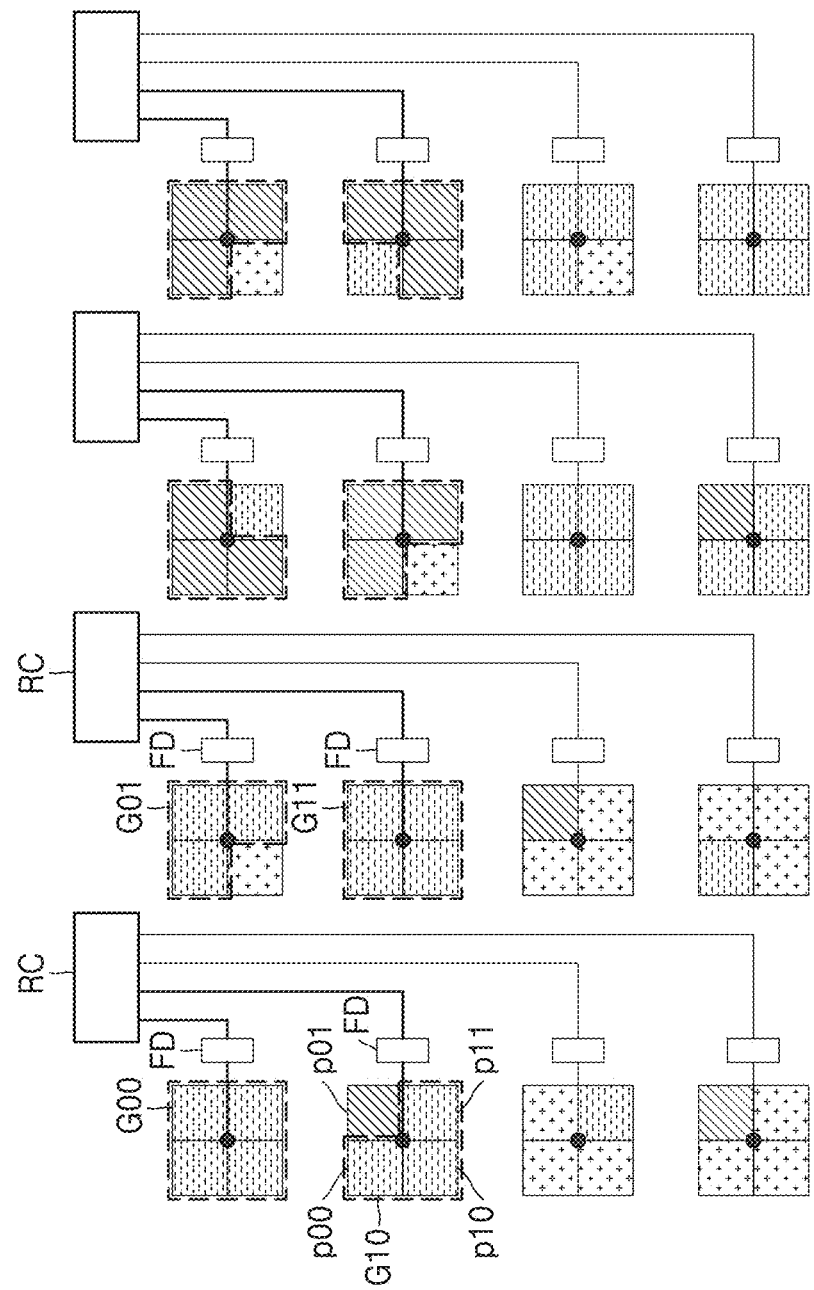
Figure 11C:
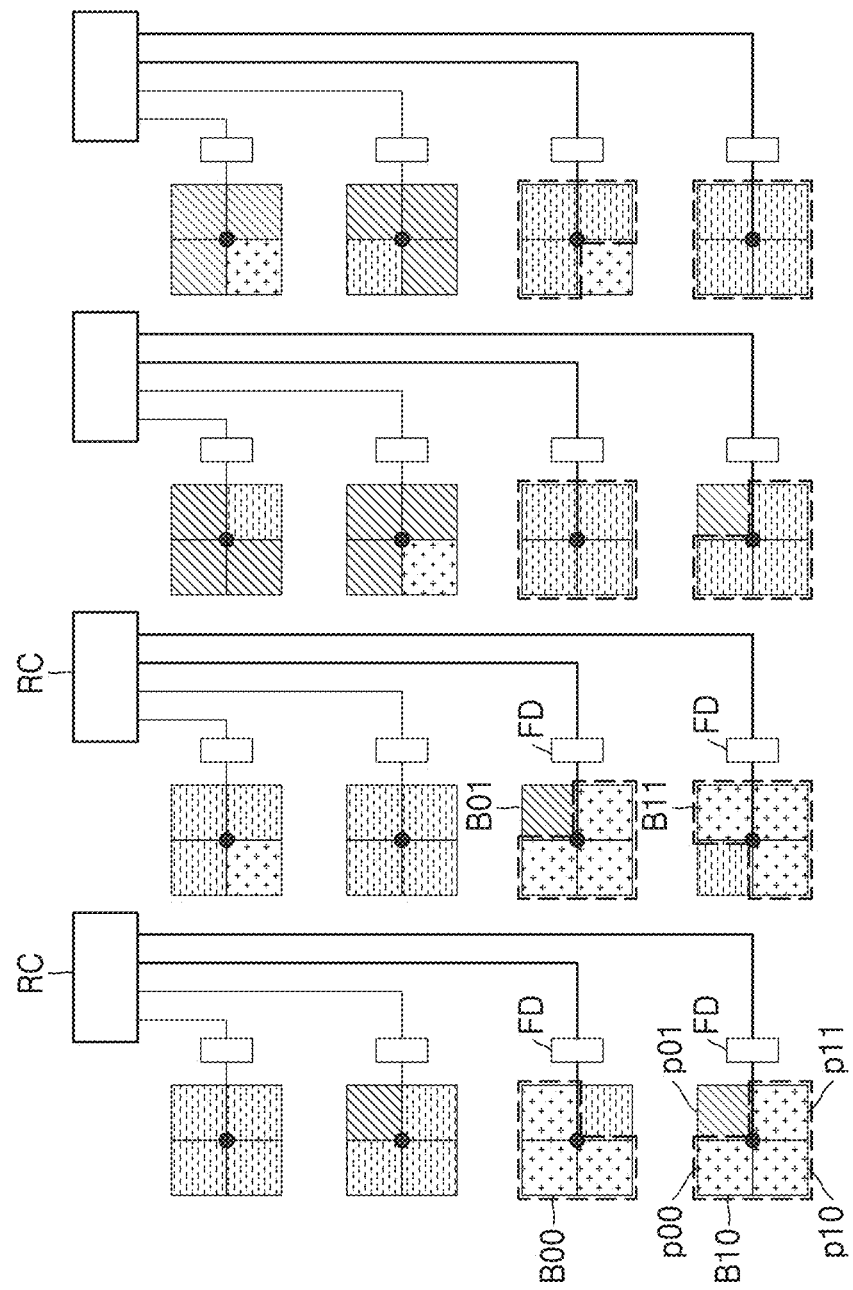

An example of performing a binning process by adding analog signals according to some example embodiments will be described below. FIGS. 11A through 11C are diagrams of some example embodiments of a pixel array according to some example embodiments.

FIG. 11A shows an example, in which a pixel array includes a plurality of color pixels and "n" color pixels CP1 through CPn share one floating diffusion region FD with each other (n being a positive integer). For example, at least some of color pixels, which sense the same color in one CFA block, may share the floating diffusion region FD with each other. According to some example embodiments, all or some of color pixels, which sense the same color in a CFA block, may share the floating diffusion region FD with each other.

Each color pixel may include a photodiode PD and a transfer gate TG. For example, when transfer gates TG of the respective "n" color pixels CP1 through CPn are all turned on, the photocharge of the "n" color pixels CP1 through CPn may be simultaneously provided to the floating diffusion region FD. When the transfer gates TG of the respective "n" color pixels CP1 through CPn are individually controlled, the photocharge of the "n" color pixels CP1 through CPn may be provided to the floating diffusion region FD at different timings. For example, when a binning mode is not executed, the photocharge of the "n" color pixels CP1 through CPn is provided to the floating diffusion region FD at different timings. When the binning mode is executed, the photocharge of the "n" color pixels CP1 through CPn is simultaneously provided to the floating diffusion region FD such that signals of the "n" color pixels CP1 through CPn may be added up in the floating diffusion region FD.

FIGS. 11B and 11C show an example operation in a binning mode, according to some example embodiments. FIGS. 11B and 11C illustrate a plurality of color pixels of a CFA cell. An example of performing a binning process on the CFA cell in FIG. 4 is illustrated in FIGS. 11B and 11C. In addition, in the example of FIGS. 11B and 11C, an intra-block method is applied to the binning process, and accordingly, signals of pixels sensing the same color in a CFA block are added up. FIG. 11B shows an example of performing a binning process on upper two CFA blocks of the CFA cell, and FIG. 11C shows an example of performing a binning process on lower two CFA blocks of the CFA cell.

Referring to FIGS. 11B and 11C, each of the CFA blocks may be divided into a plurality of groups based on a method of sharing the floating diffusion region FD. For example, the green CFA block on the left top of the CFA cell may be divided into groups G00, G01, G10, and G11, which are respectively on the left top, right top, left bottom, and right bottom of the green CFA block and each include 2*2 color pixels. Four color pixels in each of the groups G00 through G11 may share one floating diffusion region FD with one another. As the binning process is performed, photocharge of color pixels sensing the same color in each group may be provided to the floating diffusion region FD. For example, in some example embodiments of the green CFA block, photocharge of four green pixels in the group G00 may be provided to a floating diffusion region FD, photocharge of three green pixels in the group G01 may be provided to a floating diffusion region FD, photocharge of three green pixels in the group G10 may be provided to the floating diffusion region FD, and photocharge of four green pixels in the group G11 may be provided to the floating diffusion region FD. Similarly, photocharge of three pixels of each group in the red CFA block may be provided to a floating diffusion region FD.

A signal (e.g., a sum signal) provided from each of the groups G00 through G11 may be provided to a read circuit RC, and a pixel value corresponding to the sum signal may be output from the read circuit RC. The pixel values of the groups G00 through G11 may be added up by an analog or a digital calculation process, and a green pixel value corresponding to the green CFA block may be calculated by the addition.

When a binning process is not performed, each of 4*4 color pixels of the green CFA block is individually connected to and transfer photocharge to a floating diffusion region FD.

FIG. 11C illustrates the blue CFA block on the left bottom of the CFA cell and the green CFA block on the right bottom of the CFA cell. When a binning process is performed, photocharge of three blue pixels in each group in the blue CFA block may be provided to a floating diffusion region FD and added up. For example, the blue CFA block on the left bottom of the CFA cell may be divided into groups B00, B01, B10, and B11, which are respectively on the left top, right top, left bottom, and right bottom of the blue CFA block and each include 2*2 color pixels. Four color pixels in each of the groups B00 through B11 may share one floating diffusion region FD with one another. As the binning process is performed, photocharge of color pixels sensing the same color in each group may be provided to the floating diffusion region FD. For example, in some example embodiments of the blue CFA block, photocharge of four blue pixels in the group G00 may be provided to a floating diffusion region FD, photocharge of three blue pixels in the group G01 may be provided to a floating diffusion region FD, photocharge of three blue pixels in the group G10 may be provided to the floating diffusion region FD, and photocharge of four blue pixels in the group G11 may be provided to the floating diffusion region FD.

In some example embodiments of the green CFA block, each of some groups includes four green pixels, and photocharge of four green pixels may be provided to a floating diffusion region FD and added up. Each of other groups includes three green pixels, and photocharge of three green pixels may be provided to a floating diffusion region FD and added up.

Figure 12:
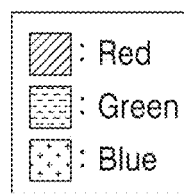
FIG. 12 illustrate examples of binning processes using an inter-block method and binning processes using an intra-block method, according to some example embodiments.

FIG. 12 illustrates examples of binning processes using an inter-block method and binning processes using an intra-block method, according to some example embodiments. FIG. 12 shows an example of a binning process of each of red, green, and blue CFA blocks.

In the red CFA block, three color pixels in the sub block and one color pixel in the outer region sense other colors than red. As the binning process is performed based on the intra-block method, twelve red pixels of the red CFA block may be added up. Similarly, fourteen green pixels of the green CFA block may be added up, and twelve blue pixels of the blue CFA block may be added up.

In some example embodiments of the inter-block method, when a pixel value corresponding to a CFA block is calculated, color pixels of at least one adjacent CFA block may be further used. For example, in the examples illustrated in FIG. 12, a color pixel in one row of an adjacent CFA block or a color pixel in two rows of an adjacent CFA block may be further used.

For example, as for the red CFA block, a signal corresponding to twelve red pixels of the red CFA block and a signal of a red pixel in one row of a CFA block adjacent to the red CFA block may be added up. Alternatively or additionally, a signal corresponding to twelve red pixels of the red CFA block and a signal of a red pixel in two rows of a CFA block adjacent to the red CFA block may be added up. Similarly, as for the blue CFA block, a signal corresponding to twelve blue pixels of the blue CFA block a signal of a blue pixel in one or two rows of a CFA block adjacent to the red CFA block may be added up.

According to some example embodiments, when a binning process is performed on the green CFA block based on the inter-block method, the green CFA block includes relatively many green pixels, and therefore, FIG. 12 shows an example, in which a signal of a green pixel in one row of a CFA block adjacent to the green CFA block is used in the binning process. However, example embodiments are not limited thereto. Green pixels in at least two rows of a CFA block adjacent to the green CFA block may be further used in signal addition.

Figure 13:
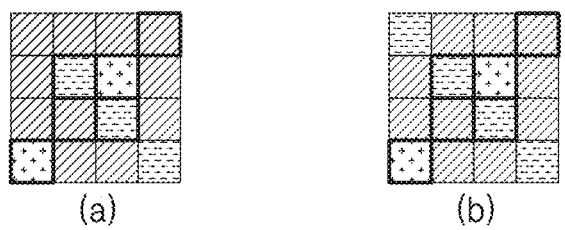
FIGS. 13 through 15 illustrate some example embodiments of CFA blocks according to some example embodiments.
Figure 14:
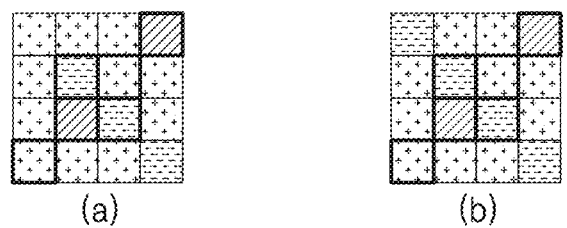
Figure 15:
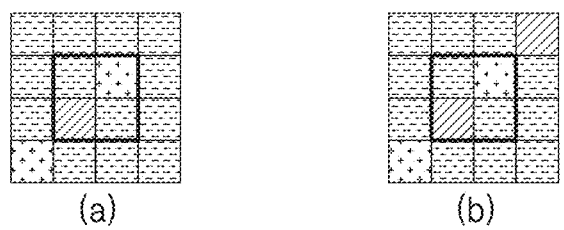

FIGS. 13 through 15 illustrate some example embodiments of CFA blocks according to some example embodiments. FIG. 13 illustrates a red CFA block, FIG. 14 illustrates a blue CFA block, and FIG. 15 illustrates a green CFA block. FIGS. 13 through 15 illustrate examples of further reducing an interpolation distance through the arrangement of color pixels in the outer region of each CFA block. Although FIGS. 13 through 15 show the CFA blocks illustrated in FIG. 4, example embodiments may also be applied to other various kinds of CFA blocks described above.

Referring to FIG. 13, the red CFA block may include a sub block including 2*2 color pixels, as described above. While red pixels are mainly arranged in the outer region of the red CFA block, a blue pixel may be arranged in a corner (e.g., the left bottom corner) of the outer region. Accordingly, red, blue, red, and blue pixels may be sequentially arranged in a certain direction (e.g., from the right top to the left bottom) of the red CFA block.

In addition, a pixel sensing at least one other color than red may be arranged in another corner of the outer region of the red CFA block. It is illustrated in (a) of FIG. 13 that a green pixel is arranged in the right bottom corner. It is illustrated in (b) of FIG. 13 that two green pixels are respectively arranged in the right bottom and left top corners. The green pixels in the outer regions shown in (a) and (b) of FIG. 13 sense the same color (i.e., green) as green pixels in corresponding positions in a Bayer pattern, and accordingly, the interpolation distance of the pixels of the red CFA block may be further reduced.

Referring to FIG. 14, while blue pixels are mainly arranged in the outer region of the blue CFA block, a red pixel may be arranged in a corner (e.g., the right top corner) of the outer region. Accordingly, red, blue, red, and blue pixels may be sequentially arranged in a certain direction (e.g., from the right top to the left bottom) of the blue CFA block. In addition, similarly to some of the example embodiments of FIG. 13, a pixel sensing at least one other color than blue may be arranged in another corner of the outer region of the blue CFA block. It is illustrated in (a) of FIG. 14 that a green pixel is arranged in the right bottom corner. It is illustrated in (b) of FIG. 14, two green pixels are respectively arranged in the right bottom and left top corners. According to the embodiment shown in (a) and (b) of FIG. 14, the interpolation distance of the pixels of the blue CFA block may be further reduced.

Referring to FIG. 15, pixels (e.g., a red pixel and/or a blue pixel) sensing at least one other color than green may be arranged in the outer region of the green CFA block. It is illustrated in (a) of FIG. 15 that a blue pixel is arranged in one corner (e.g., the left bottom corner) of the outer region of the green CFA block. It is illustrated in (b) of FIG. 15 that a blue pixel is arranged in the left bottom corner of the outer region of the green CFA block and a red pixel is arranged in the right top corner of the outer region of the green CFA block. Color pixels (e.g., a blue pixel and/or or a red pixel) in the outer regions shown in (a) and (b) of FIG. 15 sense the same color as color pixels in corresponding positions in a Bayer pattern, and accordingly, the interpolation distance of the pixels of the green CFA block may be further reduced.

Figure 16:
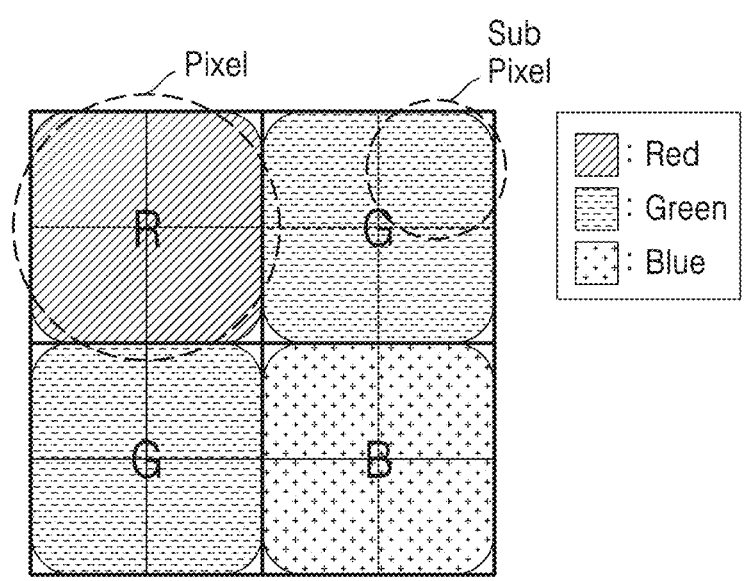
FIG. 16 illustrates some example embodiments of a color pixel according to some example embodiments.

FIG. 16 illustrates some example embodiments of a color pixel according to some example embodiments.

According to some example embodiments described above, a color pixel may include a corresponding color filter and a photosensitive element (e.g., a photodiode) sensing light (or color).

According to some example embodiments, a color pixel may include a plurality of sub pixels. FIG. 16 illustrates an example, in which a color pixel includes 2*2 sub pixels, but a color pixel may include more sub pixels. The photosensitive element is provided for each sub pixel, and accordingly, a plurality of photosensitive elements may be provided for a color pixel. Although not shown in FIG. 16, an image sensor may include a plurality of microlenses (now shown), and a microlens may be provided for each pixel or each sub pixel.

When a pixel signal corresponding to a color pixel is calculated, at least some of signals generated by a plurality of sub pixels may be used. For example, assuming that a color pixel on the left top of FIG. 16 is a red pixel and a plurality of sub pixels sense a red color, a pixel signal of the red pixel may be generated by a process using at least some of signals generated by the sub pixels.

Embodiments may be variously realized. For example, a color pixel may provide signals resulting from sensing at least two colors. For example, color filters sensing different colors may be arranged for a plurality of sub pixels of a color pixel, and the color pixel may be variously implemented as long as an interpolation distance may be reduced according to some example embodiments described above.

Figure 17:
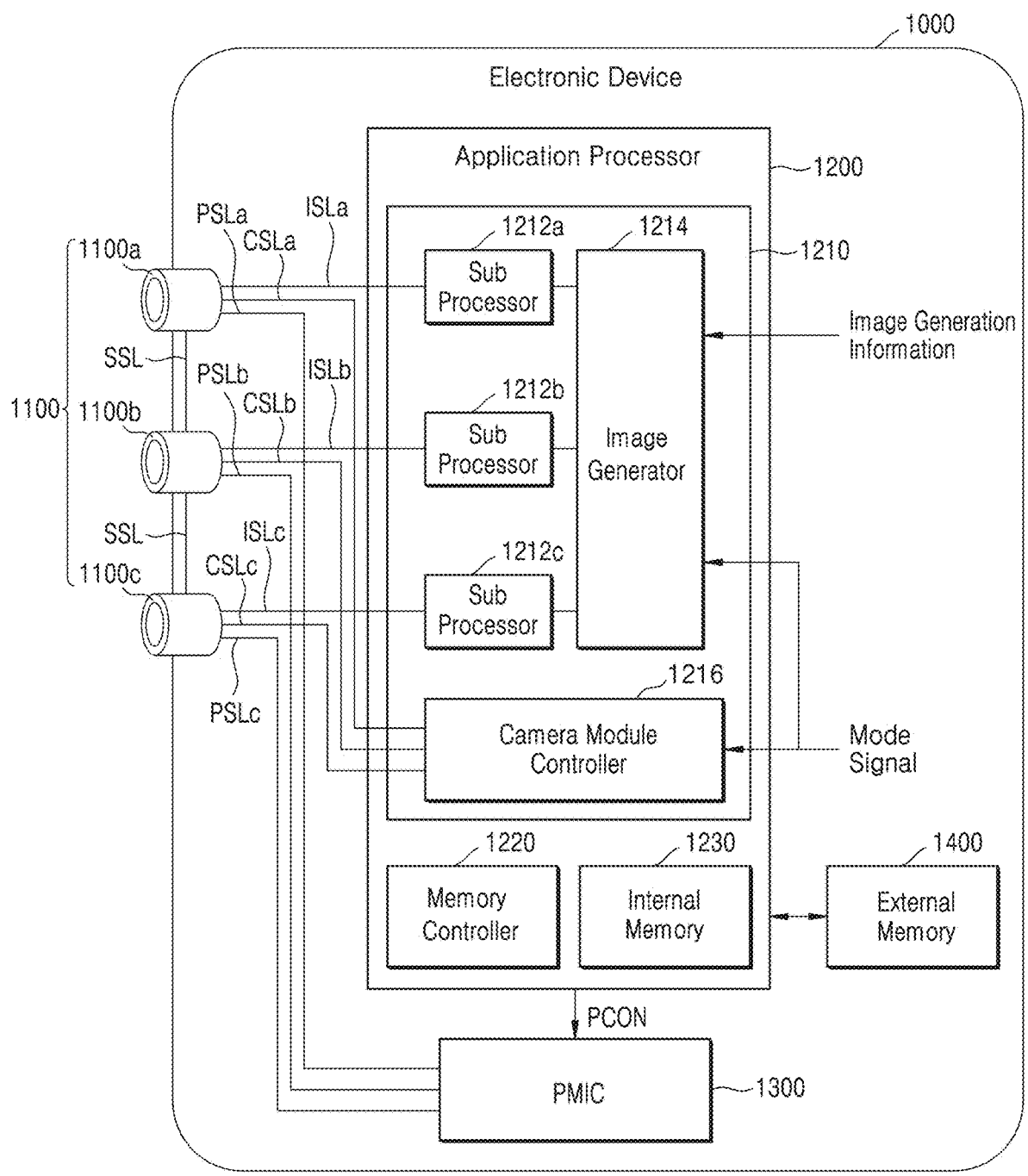
FIGS. 17 and 18 are block diagrams of an electronic device including a multi-camera module using an image sensor, according to some example embodiments.
Figure 18:
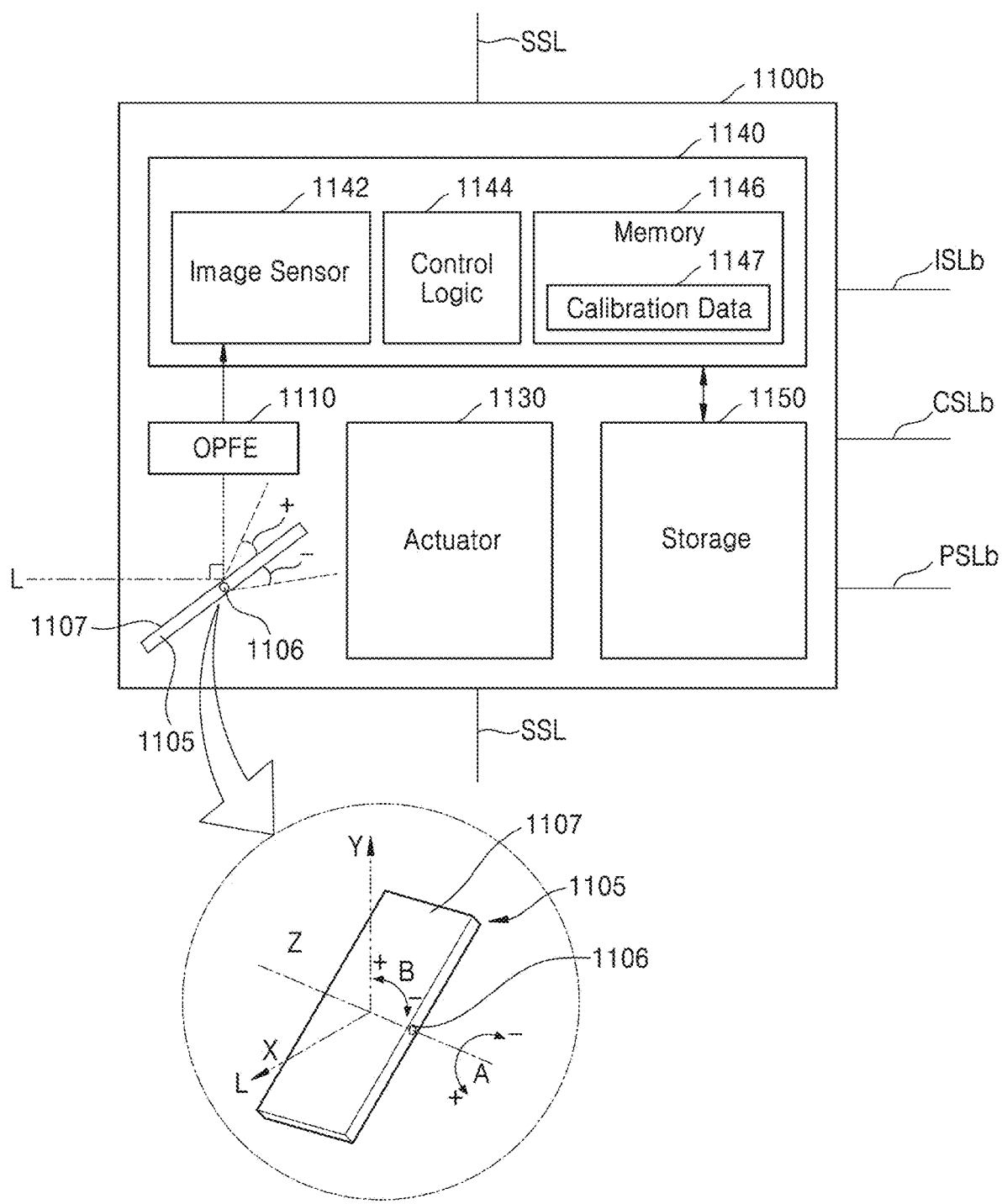

FIG. 17 is a block diagram of an electronic device including a multi-camera module using an image sensor, according to some example embodiments. FIG. 18 is a detailed block diagram of a camera module in FIG. 17.

Referring to FIG. 17, an electronic device 1000 may include a camera module group 1100, an application processor 1200, a power management integrated circuit (PMIC) 1300, and an external memory 1400.

The camera module group 1100 may include a plurality of camera modules 1100a, 1100b, and 1100c. Although three camera modules 1100a, 1100b, and 1100c are illustrated in FIG. 17, example embodiments are not limited thereto. In some example embodiments, the camera module group 1100 may be modified to include only two camera modules. In some example embodiments, the camera module group 1100 may be modified to include "n" camera modules, where "n" is a natural number of at least 4.

The detailed configuration of the camera module 1100b will be described with reference to FIG. 18 below. The descriptions below may also applied to the other camera modules 1100a and 1100c.

Referring to FIG. 18, the camera module 1100b may include a prism 1105, an optical path folding element (OPFE) 1110, an actuator 1130, an image sensing device 1140, and a storage 1150.

The prism 1105 may include a reflective surface 1107 of a light reflecting material and may change the path of light L incident from outside.

In some example embodiments, the prism 1105 may change the path of the light L incident in a first direction X into a second direction Y perpendicular to the first direction X. The prism 1105 may rotate the reflective surface 1107 of the light reflecting material in a direction A around a central shaft 1106 or rotate the central shaft 1106 in a direction B so that the path of the light L incident in the first direction X is changed into the second direction Y perpendicular to the first direction X. At this time, the OPFE 1110 may move in a third direction Z, which is perpendicular to the first and second directions X and Y.

In some example embodiments, an A-direction maximum rotation angle of the prism 1105 may be less than or equal to 15 degrees in a plus (+) A direction and greater than 15 degrees in a minus (−) A direction, but embodiments are not limited thereto.

In some example embodiment, the prism 1105 may move by an angle of about 20 degrees or in a range from about 10 degrees to about 20 degrees or from about 15 degrees to about 20 degrees in a plus or minus B direction. At this time, an angle by which the prism 1105 moves in the plus B direction may be the same as or similar, within a difference of about 1 degree, to an angle by which the prism 1105 moves in the minus B direction.

In some example embodiments, the prism 1105 may move the reflective surface 1107 of the light reflecting material in the third direction Z parallel with an extension direction of the central shaft 1106.

The OPFE 1110 may include, for example, "m" optical lenses, where "m" is a natural number. The "m" lenses may move in the second direction Y and change an optical zoom ratio of the camera module 1100b. For example, when the default optical zoom ratio of the camera module 1100b is Z, the optical zoom ratio of the camera module 1100b may be changed to 3Z, 5Z, or greater by moving the "m" optical lenses included in the OPFE 1110.

The actuator 1130 may move the OPFE 1110 or an optical lens to a certain position. For example, the actuator 1130 may adjust the position of the optical lens such that an image sensor 1142 is positioned at a focal length of the optical lens for accurate sensing.

The image sensing device 1140 may include the image sensor 1142, a control logic 1144, and a memory 1146. The image sensor 1142 may sense an image of an object using the light L provided through the optical lens. According to some example embodiments described above, the image sensor 1142 may include a pixel array, and a color pattern of a plurality of color pixels of the pixel array may follow the patterns of a CFA cell, a CFA block, and a sub block in some example embodiments described above.

The control logic 1144 may generally control operations of the camera module 1100b. For example, the control logic 1144 may control operation of the camera module 1100b according to a control signal provided through a control signal line CSLb.

The memory 1146 may store information, such as calibration data 1147, necessary for the operation of the camera module 1100b. The calibration data 1147 may include information, which is necessary for the camera module 1100b to generate image data using the light L provided from outside. For example, the calibration data 1147 may include information about the degree of rotation described above, information about a focal length, information about an optical axis, or the like. When the camera module 1100b is implemented as a multi-state camera that has a focal length varying with the position of the optical lens, the calibration data 1147 may include a value of a focal length for each position (or state) of the optical lens and information about auto focusing.

The storage 1150 may store image data sensed by the image sensor 1142. The storage 1150 may be provided outside the image sensing device 1140 and may form a stack with a sensor chip of the image sensing device 1140. In some embodiments, the storage 1150 may include electrically erasable programmable read-only memory (EEPROM), but embodiments are not limited thereto.

In some example embodiments, each of the camera modules 1100a, 1100b, and 1100c may include the actuator 1130. Accordingly, the camera modules 1100a, 1100b, and 1100c may include the calibration data 1147, which is the same or different among the camera modules 1100a, 1100b, and 1100c according to the operation of the actuator 1130 included in each of the camera modules 1100a, 1100b, and 1100c.

In some example embodiments, one (e.g., the camera module 1100b) of the camera modules 1100a, 1100b, and 1100c may be of a folded-lens type including the prism 1105 and the OPFE 1110 while the other camera modules (e.g., the camera modules 1100a and 1100c) may be of a vertical type that does not include the prism 1105 and the OPFE 1110. However, example embodiments are not limited thereto.

In some example embodiments, one (e.g., the camera module 1100c) of the camera modules 1100a, 1100b, and 1100c may include a vertical depth camera, which extracts depth information using an infrared ray (IR). In this case, the application processor 1200 may generate a three-dimensional (3D) depth image by merging image data provided from the depth camera with image data provided from another camera module (e.g., the camera module 1100a or 1100b).

In some example embodiments, at least two camera modules (e.g., 1100a and 1100b) among the camera modules 1100a, 1100b, and 1100c may have different field-of-views. In this case, the two camera modules (e.g., 1100a and 1100b) among the camera modules 1100a, 1100b, and 1100c may respectively have different optical lenses, but embodiments are not limited thereto.

In some example embodiments, the camera modules 1100a, 1100b, and 1100c may have different field-of-views from one another. In this case, the camera modules 1100a, 1100b, and 1100c may respectively have different optical lenses, but embodiments are not limited thereto.

In some example embodiments, the camera modules 1100a, 1100b, and 1100c may be physically separated from one another. In other words, the sensing area of the image sensor 1142 is not divided and used by the camera modules 1100a, 1100b, and 1100c, but the image sensor 1142 may be independently included in each of the camera modules 1100a, 1100b, and 1100c.

Referring back to FIG. 17, the application processor 1200 may include an image processing unit 1210, a memory controller 1220, and an internal memory 1230. The application processor 1200 may be separately implemented from the camera modules 1100a, 1100b, and 1100c. For example, the application processor 1200 and the camera modules 1100a, 1100b, and 1100c may be implemented in different semiconductor chips.

The image processing unit 1210 may include a plurality of sub processors 1212a, 1212b, and 1212c, an image generator 1214, and a camera module controller 1216.

The image processing unit 1210 may include as many sub processors 1212a, 1212b, and 1212c as the camera modules 1100a, 1100b, and 1100c.

Image data generated from each camera module 1100a, 1100b, or 1100c may be provided to a corresponding one of the sub processors 1212a, 1212b, and 1212c through a corresponding one of separate image signal lines ISLa, ISLb, and ISLc. For example, image data generated from the camera module 1100a may be provided to the sub processor 1212a through the image signal line ISLa, image data generated from the camera module 1100b may be provided to the sub processor 1212b through the image signal line ISLb, and image data generated from the camera module 1100c may be provided to the sub processor 1212c through the image signal line ISLc. Such image data transmission may be performed using, for example, a mobile industry processor interface (MIPI) based camera serial interface (CSI), but embodiments are not limited thereto.

In some example embodiments, a single sub processor may be provided for a plurality of camera modules. For example, differently from FIG. 13, the sub processors 1212a and 1212c may not be separated but may be integrated into a single sub processor, and the image data provided from the camera module 1100a or the camera module 1100c may be selected by a selection element (e.g., a multiplexer) and then provided to the integrated sub processor.

The image data provided to each of the sub processors 1212a, 1212b, and 1212c may be provided to the image generator 1214. The image generator 1214 may generate an output image using the image data provided from each of the sub processors 1212a, 1212b, and 1212c according to image generation information or a mode signal.

In detail, the image generator 1214 may generate the output image by merging at least portions of respective pieces of image data, which are respectively generated from the camera modules 1100a, 1100b, and 1100c having different field-of-views, according to the image generation information or the mode signal. Alternatively or additionally, the image generator 1214 may generate the output image by selecting one of pieces of image data, which are respectively generated from the camera modules 1100a, 1100b, and 1100c having different field-of-views, according to the image generation information or the mode signal.

In some example embodiments, the image generation information may include a zoom signal or a zoom factor. In some example embodiments, the mode signal may be based on a mode selected by a user.

When the image generation information includes a zoom signal or a zoom factor and the camera modules 1100a, 1100b, and 1100c have different field-of-views, the image generator 1214 may perform different operations according to different kinds of zoom signals. For example, when the zoom signal is a first signal, the image generator 1214 may merge image data output from the camera module 1100a with image data output from the camera module 1100c and then generate an output image using a merged image signal and image data output from the camera module 1100b, which has not been used in the merging. When the zoom signal is a second signal different from the first signal, the image generator 1214 may not perform this image data merging but select one of pieces of image data respectively output from the camera modules 1100a through 1100c to generate an output image. However, example embodiments are not limited thereto, and a method of processing image data may be changed whenever necessary.

In some example embodiments, the image generator 1214 may receive a plurality of pieces of image data, which have different exposure times, from at least one of the sub processors 1212a, 1212b, and 1212c and perform high dynamic range (HDR) processing on the pieces of image data, thereby generating merged image data having an increased dynamic range.

The camera module controller 1216 may provide a control signal to each of the camera modules 1100a, 1100b, and 1100c. A control signal generated by the camera module controller 1216 may be provided to a corresponding one of the camera modules 1100a, 1100b, and 1100c through a corresponding one of control signal lines CSLa, CSLb, and CSLc, which are separated from one another.

One (e.g., the camera module 1100b) of the camera modules 1100a, 1100b, and 1100c may be designated as a master camera according to the mode signal or the image generation signal including a zoom signal, and the other camera modules (e.g., 1100a and 1100c) may be designated as slave cameras. Such designation information may be included in a control signal and provided to each of the camera modules 1100a, 1100b, and 1100c through a corresponding one of the control signal lines CSLa, CSLb, and CSLc, which are separated from one another.

A camera module operating as a master or a slave may be changed according to a zoom factor or an operation mode signal. For example, when the field-of-view of the camera module 1100a is greater than that of the camera module 1100b and the zoom factor indicates a low zoom ratio, the camera module 1100b may operate as a master and the camera module 1100a may operate as a slave. Contrarily, when the zoom factor indicates a high zoom ratio, the camera module 1100a may operate as a master and the camera module 1100b may operate as a slave.

In some example embodiments, a control signal provided from the camera module controller 1216 to each of the camera modules 1100a, 1100b, and 1100c may include a sync enable signal. For example, when the camera module 1100b is a master camera and the camera modules 1100a and 1100c are slave cameras, the camera module controller 1216 may transmit the sync enable signal to the camera module 1100b. The camera module 1100b provided with the sync enable signal may generate a sync signal based on the sync enable signal and may provide the sync signal to the camera modules 1100a and 1100c through a sync signal line SSL. The camera modules 1100a, 1100b, and 1100c may be synchronized with the sync signal and may transmit image data to the application processor 1200.

In some example embodiments, a control signal provided from the camera module controller 1216 to each of the camera modules 1100a, 1100b, and 1100c may include mode information according to the mode signal. The camera modules 1100a, 1100b, and 1100c may operate in a first operation mode or a second operation mode in relation with a sensing speed based on the mode information.

In the first operation mode, the camera modules 1100a, 1100b, and 1100c may generate an image signal at a first speed (e.g., at a first frame rate), encode the image signal at a second speed higher than the first speed (e.g., at a second frame rate higher than the first frame rate), and transmit an encoded image signal to the application processor 1200. At this time, the second speed may be at most 30 times the first speed.

The application processor 1200 may store the received image signal, e.g., the encoded image signal, in the internal memory 1230 therein or the external memory 1400 outside the application processor 1200. Thereafter, the application processor 1200 may read the encoded image signal from the internal memory 1230 or the external memory 1400, decode the encoded image signal, and display image data generated based on a decoded image signal. For example, a corresponding one of the sub processors 1212a, 1212b, and 1212c of the image processing unit 1210 may perform the decoding and may also perform image processing on the decoded image signal.

In the second operation mode, the camera modules 1100a, 1100b, and 1100c may generate an image signal at a third speed lower than the first speed (e.g., at a third frame rate lower than the first frame rate) and transmit the image signal to the application processor 1200. The image signal provided to the application processor 1200 may not have been encoded. The application processor 1200 may perform image processing on the image signal or store the image signal in the internal memory 1230 or the external memory 1400.

The PMIC 1300 may provide power, e.g., a power supply voltage, to each of the camera modules 1100a, 1100b, and 1100c. For example, under the control of the application processor 1200, the PMIC 1300 may provide first power to the camera module 1100a through a power signal line PSLa, second power to the camera module 1100b through a power signal line PSLb, and third power to the camera module 1100c through a power signal line PSLc.

The PMIC 1300 may generate power corresponding to each of the camera modules 1100a, 1100b, and 1100c and adjust the level of the power, in response to a power control signal PCON from the application processor 1200. The power control signal PCON may include a power adjustment signal for each operation mode of the camera modules 1100a, 1100b, and 1100c. For example, the operation mode may include a low-power mode. At this time, the power control signal PCON may include information about a camera module to operate in the low-power mode and a power level to be set. The same or different levels of power may be respectively provided to the camera modules 1100a, 1100b, and 1100c. The level of power may be dynamically changed.

It will be understood that some or all of any of the devices, controllers, generators, decoders, units, modules, circuits, processors, or the like according to any of the example embodiments as described herein, including some or all of any of the elements of the controller 140 and read circuit 130 shown in FIG. 1, the image processor 220, binning processor 221, and remosaic processor 222 shown in FIG. 10, the application processor 1200 and its sub elements shown in FIG. 17, the image sensing device 1140 and its sub elements shown in FIG. 18, any combination thereof, or the like may be included in, may include, and/or may be implemented by one or more instances of processing circuitry such as hardware including logic circuits, a hardware/software combination such as a processor executing software; or a combination thereof. In some example embodiments, said one or more instances of processing circuitry may include, but are not limited to, a central processing unit (CPU), an application processor (AP), an arithmetic logic unit (ALU), a graphic processing unit (GPU), a digital signal processor, a microcomputer, a field programmable gate array (FPGA), a System-on-Chip (SoC) a programmable logic unit, a microprocessor, or an application-specific integrated circuit (ASIC), etc. In some example embodiments, any of the memories, memory units, or the like as described herein may include a non-transitory computer readable storage device, for example a solid state drive (SSD), storing a program of instructions, and the one or more instances of processing circuitry may be configured to execute the program of instructions to implement the functionality of some or all of any of the devices, controllers, decoders, units, modules, or the like according to any of the example embodiments as described herein, including any of the methods of operating any of same as described herein.

Although each of the elements of the controller 140 and read circuit 130 shown in FIG. 1, the image processor 220, binning processor 221, and remosaic processor 222 shown in FIG. 10, the application processor 1200 and its sub elements shown in FIG. 17, the image sensing device 1140 and its sub elements shown in FIG. 18 are illustrated as being distinct, example embodiments are not limited thereto, and some of the functions of one of the above may be performed by others of the features of the relevant figures. This may also be the case of additional elements within the above as described in example embodiments herein.

While the inventive concepts have been particularly shown and described with reference to embodiments thereof, it will be understood that various changes in form and details may be made therein without departing from the spirit and scope of the following claims.

What is claimed is:

1. A pixel array of an image sensor, the pixel array comprising:
  a plurality of color filter array (CFA) cells having a certain size, each of the plurality of CFA cells including a plurality of CFA blocks in a width direction of the CFA cell and a length direction of the CFA cell,
  wherein each of the plurality of CFA blocks includes a sub block and an outer region other than the sub block, the sub block being at a central region of each of the plurality of CFA blocks and including m*n color pixels, and the outer region including other color pixels, where "m" and "n" are integers of at least 2,
  wherein the m*n color pixels of the sub block include color pixels sensing first, second, and third colors, and the outer region includes a number of first pixels sensing the first color and a number of second pixels sensing at least one selected from the second color and the third color, the number of first pixels being greater than the number of second pixels, and each color pixel on a border of the sub block is adjacent to at least one first pixel of the outer region in a horizontal direction or a vertical direction, and
  wherein the first color of at least 2 CFA blocks within a CFA cell are different.

2. The pixel array of claim 1, wherein the first, second, and third colors include a red color, a green color, and a blue color; and
  each of the plurality of CFA cells includes 2*2 CFA blocks in the width and length directions of the CFA cell, wherein the 2*2 CFA blocks include two green CFA blocks, one red CFA block, and one blue CFA block, and
  each of the 2*2 CFA blocks includes 4*4 color pixels, and the sub block of each of the 2*2 CFA blocks includes 2*2 color pixels.

3. The pixel array of claim 2, wherein the outer region of the red CFA block includes, as the second pixel, a blue pixel in at least one corner of the red CFA block and, as the first pixels, a plurality of red pixels.

4. The pixel array of claim 3, wherein a red pixel, a blue pixel, a red pixel, and a blue pixel are sequentially arranged in a diagonal direction from one corner of the red CFA block.

5. The pixel array of claim 2, wherein the outer region of the blue CFA block includes, as the second pixel, a red pixel in at least one corner of the blue CFA block and, as the first pixels, a plurality of blue pixels.

6. The pixel array of claim 2, wherein the outer region of each of the two green CFA blocks includes only green pixels.

7. The pixel array of claim 2, wherein four color pixels including one color pixel in outer regions of the respective 2*2 CFA blocks form a first region in each of the plurality of CFA cells,
  wherein the first region includes the second pixel of the red CFA block, the second pixel of the blue CFA block, and a green pixel of the outer region of each of the two green CFA blocks; and
  an interpolation distance of each of the four color pixels of the first region has a value of 0 when each of the plurality of CFA cells is converted into a Bayer pattern by a remosaic process.

8. The pixel array of claim 1, further comprising a binning processor configured to perform a binning process on color pixels of the pixel array, wherein signals of color pixels sensing a same color in one of the plurality of CFA blocks are selectively added up during the binning process.

9. The pixel array of claim 1, further comprising a binning processor configured to perform a binning process on color pixels of the pixel array, wherein signals of color pixels sensing a same color in one of the plurality of CFA blocks and in at least one line of an adjacent CFA block are added up during the binning process.

10. A pixel array of an image sensor, the pixel array comprising:
  a plurality of color filter array (CFA) cells having a certain size, each of the plurality of CFA cells including 2*2 CFA blocks in a width direction of the CFA cell and a length direction of the CFA cell, each of the 2*2 CFA blocks including 4*4 color pixels,
  wherein each of the 2*2 CFA blocks includes a sub block and an outer region, the sub block being at a central region of each of the 2*2 CFA blocks and including 2*2 color pixels, and the outer region being at an outer side of each of the 2*2 CFA blocks and including twelve color pixels;
  the 2*2 CFA blocks include a red CFA block, a green CFA block, and a blue CFA block; and the sub block includes one red pixel, one blue pixel, and two green pixels,
  wherein twelve color pixels in the outer region of the red CFA block include one blue pixel and eleven red pixels.

11. The pixel array of claim 10, wherein the one blue pixel in the outer region of the red CFA block is in one corner of the red CFA block.

12. The pixel array of claim 11, wherein a blue pixel, a red pixel, a blue pixel, and a red pixel are sequentially arranged in a diagonal direction from the one corner of the red CFA block having the one blue pixel arranged therein.

13. The pixel array of claim 10, wherein twelve color pixels in the outer region of the blue CFA block include one red pixel and eleven blue pixels.

14. The pixel array of claim 13, wherein each of the plurality of CFA cells includes one red CFA block, two green CFA blocks, and one blue CFA block,
  wherein the one blue pixel in the outer region of the red CFA block, the one red pixel in the outer region of the blue CFA block, and two green pixel in the respective outer regions of the two green CFA blocks form a first region, wherein an interpolation distance of each of color pixels in the first region has a value of 0 when each of the plurality of CFA cells is converted into a Bayer pattern by a remosaic process.

15. The pixel array of claim 10, wherein twelve color pixels in the outer region of the green CFA block include at most two color pixels and remaining green pixels, the at most two color pixels sensing at least one selected from a red color and a blue color.

16. An image sensor comprising:
a pixel array including a plurality of color filter array (CFA) cells each including a plurality of CFA blocks in a width direction of the CFA cell and a length direction of the CFA cell, each of the plurality of CFA blocks including a sub block and an outer region other than the sub block, the sub block being at a central region of each of the plurality of CFA blocks and including n*n color pixels, and the outer region including other color pixels, where "n" is an integer of at least 2; and
a read circuit configured to read pixel values from color pixels of the pixel array,
wherein the n*n color pixels of the sub block include color pixels sensing first, second and third colors, and the outer region includes a number of first pixels sensing one of the first, second and third colors and a number of second pixels sensing another one of the first, second and third colors, the number of first pixels being greater than the number of second pixels, and each color pixel on a border of the sub block is adjacent to at least one first pixel of the outer region in a horizontal direction or a vertical direction, and
wherein the first color of at least 2 CFA blocks within a CFA cell are different.

17. The image sensor of claim 16, wherein the first, second, and third colors include a red color, a green color, and a blue color;
each of the plurality of CFA cells includes 2*2 CFA blocks in the width and length directions, wherein the 2*2 CFA blocks include two green CFA blocks, one red CFA block, and one blue CFA block; and
each of the 2*2 CFA blocks includes 4*4 color pixels, and the sub block of each of the 2*2 CFA blocks includes 2*2 color pixels.

18. The image sensor of claim 17, wherein the outer region of the red CFA block includes one blue pixel in a corner of the red CFA block and eleven red pixels; and
the outer region of the blue CFA block includes one red pixel in a corner of the blue CFA block and eleven blue pixels.

19. The image sensor of claim 16, further comprising a binning processor configured to perform a binning process based on pixel values from the pixel array,
wherein signals of color pixels sensing a same color in one of the plurality of CFA blocks are selectively added up during the binning process.

20. The image sensor of claim 16, further comprising a binning processor configured to perform a binning process based on pixel values from the pixel array,
wherein signals of color pixels sensing a same color in one of the plurality of CFA blocks and in at least one line of an adjacent CFA block are added up during the binning process.

* * * * *